US012699477B2

(12) United States Patent　　　　(10) Patent No.:　US 12,699,477 B2
You　　　　　　　　　　　　　　　　(45) Date of Patent:　　　Aug. 4, 2026

(54) TOUCH SENSING UNIT MINIMIZING CONTACT DEFECTS BETWEEN CONDUCTIVE LAYERS OF TOUCH SIGNAL LINES

(71) Applicant: SAMSUNG DISPLAY CO., LTD., Yongin-si (KR)

(72) Inventor: Chun Gi You, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/357,063

(22) Filed: Jul. 21, 2023

(65) Prior Publication Data

US 2024/0192799 A1　　Jun. 13, 2024

(30) Foreign Application Priority Data

Dec. 7, 2022　(KR) ......................... 10-2022-0169430

(51) Int. Cl.
　　*G06F 3/041*　　　(2006.01)
　　*G06F 3/044*　　　(2006.01)
　　*H10K 59/40*　　　(2023.01)
(52) U.S. Cl.
　　CPC ........ *G06F 3/04164* (2019.05); *G06F 3/0443* (2019.05); *H10K 59/40* (2023.02); *G06F 3/0446* (2019.05); *G06F 2203/04103* (2013.01)
(58) Field of Classification Search
　　CPC ...... G06F 3/041; G06F 3/0412; G06F 3/0414; G06F 3/04164; G06F 3/044; G06F 3/0446; G06F 3/045; G06F 3/046; G06F 3/047; G06F 3/048

USPC .................................................. 345/173–179
See application file for complete search history.

(56) References Cited

U.S. PATENT DOCUMENTS

| | | | |
|---|---|---|---|
| 7,763,587 B2 | 7/2010 | Michelet et al. | |
| 2015/0084888 A1* | 3/2015 | Han ..................... | G06F 3/0412 |
| | | | 345/173 |
| 2015/0145813 A1* | 5/2015 | Takiguchi ............. | G06F 3/0446 |
| | | | 345/174 |
| 2015/0227234 A1* | 8/2015 | Mu ........................... | G06F 1/16 |
| | | | 345/174 |
| 2016/0154499 A1* | 6/2016 | Bae ....................... | G06F 3/0446 |
| | | | 345/174 |

(Continued)

FOREIGN PATENT DOCUMENTS

KR　　10-2020-0114765　　　10/2020

*Primary Examiner* — Ke Xiao
*Assistant Examiner* — Nelson Lam
(74) *Attorney, Agent, or Firm* — F. CHAU & ASSOCIATES, LLC

(57)　　　　　　ABSTRACT

A touch sensing unit that minimizes a contact defect between conductive layers of a touch signal line includes a substrate; a touch electrode disposed in a touch sensor area of the substrate; and a touch signal line connected to the touch electrode and that extends to a touch peripheral area of the substrate. The touch signal line includes a first conductive layer disposed on the substrate, and a second conductive layer disposed on the first conductive layer with an insulating layer interposed therebetween. The second conductive layer is in contact with the first conductive layer through a contact hole in the insulating layer. The first conductive layer includes at least one of Mo, MoNb, Ti or Ta, and the second conductive layer includes at least one of Al or AlNb.

23 Claims, 22 Drawing Sheets

(56)                References Cited

U.S. PATENT DOCUMENTS

| | | | | |
|---|---|---|---|---|
| 2016/0202780 A1* | 7/2016 | Chien | G06F 3/0443 | |
| | | | 345/173 | |
| 2016/0202816 A1* | 7/2016 | Park | G06F 1/1652 | |
| | | | 345/173 | |
| 2018/0018053 A1* | 1/2018 | No | G06F 3/0446 | |
| 2021/0280642 A1* | 9/2021 | Lee | H10K 59/12 | |
| 2022/0164047 A1* | 5/2022 | Kim | G06F 3/0446 | |
| 2022/0413656 A1* | 12/2022 | Wang | G06F 3/0443 | |
| 2023/0142449 A1* | 5/2023 | Chu | G06F 3/0445 | |
| | | | 345/173 | |
| 2023/0214076 A1* | 7/2023 | Chu, II | H10K 59/40 | |
| | | | 345/173 | |
| 2023/0315226 A1* | 10/2023 | Tong | G06F 3/0412 | |
| | | | 345/174 | |
| 2023/0315236 A1* | 10/2023 | Yang | G06F 3/0448 | |
| | | | 345/174 | |

* cited by examiner

TOUCH SENSING UNIT MINIMIZING CONTACT DEFECTS BETWEEN CONDUCTIVE LAYERS OF TOUCH SIGNAL LINES

CROSS-REFERENCE TO RELATED APPLICATION

This application claims priority under 35 U.S.C. 119 from Korean Patent Application No. 10-2022-0169430, filed on Dec. 7, 2022 in the Korean Intellectual Property Office, the contents of which are herein incorporated by reference in their entirety.

TECHNICAL FIELD

Embodiments of the present disclosure are directed to a touch sensing unit, and more particularly, to a touch sensing unit that minimizes a contact defect between conductive layers of a touch signal line, a display device and a manufacturing method thereof.

DISCUSSION OF THE RELATED ART

Electronic devices, such as smart phones, tablet PCs, digital cameras, laptop computers, navigation systems and televisions (TVs), which provide images to users, include display devices for displaying images. The display device includes a display panel for generating and displaying an image, and various input devices.

Recently, a touch sensing unit that recognizes a touch input applied to a smart phone or a tablet PC has been widely used as an input device of a display device. The touch sensing unit determines whether a user has performed a touch input, and calculates a corresponding position as a touch input coordinate.

The touch sensing unit includes a touch signal line that electrically connects a touch electrode with a touch driving circuit. The touch signal line typically includes a plurality of conductive layers that are directly in contact with each other to implement low resistance.

However, according to the related art, a first formed conductive layer of the conductive layers used for low resistance may encounter the following situation. For example, after a lower conductive layer used for low resistance is first formed and patterned, a conductive layer below the patterned lower conductive layer may be oxidized. For example, an oxide layer can form on a surface of the lower conductive layer. Then, an upper conductive layer formed after patterning the lower conductive layer lacks good contact with the lower conductive layer due to the oxide layer. For example, a contact defect between the lower conductive layer and the upper conductive layer occurs due to the oxide layer of the lower conductive layer. As a result, signal transmission capability of the touch signal line is affected.

SUMMARY

Embodiments of the present disclosure provide a touch sensing unit that minimizes contact defects between conductive layers of a touch signal line, a display device and a manufacturing method thereof.

According to an embodiment of the disclosure, a touch sensing unit includes: a substrate; a touch electrode disposed in a touch sensor area of the substrate; and a touch signal line connected to the touch electrode and that extends to a touch peripheral area of the substrate. The touch signal line includes a first conductive layer disposed on the substrate, and a second conductive layer disposed on the first conductive layer with an insulating layer interposed therebetween. The second conductive layer is in contact with the first conductive layer through a contact hole in the insulating layer. The first conductive layer includes at least one of Mo, MoNb, Ti or Ta, and the second conductive layer includes at least one of Al or AlNb.

In an embodiment, the first conductive layer of the (1-1)th touch signal line is made of a same material as a connection electrode disposed in the touch sensor area.

In an embodiment, the first conductive layer is disposed on a same layer as the connection electrode.

In an embodiment, the second conductive layer is disposed on a same layer as the touch electrode.

In an embodiment, the touch signal line further includes a third conductive layer disposed on the second conductive layer. The third conductive layer is in contact with the second conductive layer.

In an embodiment, the third conductive layer surrounds the second conductive layer exposed by the contact hole.

In an embodiment, the third conductive layer is directly in contact with the second conductive layer.

In an embodiment, the third conductive layer includes a transparent conductive layer.

In an embodiment, the third conductive layer is made of a same material as the touch electrode.

In an embodiment, the third conductive layer is disposed on a same layer as the touch electrode.

In an embodiment, the insulating layer includes a plurality of contact holes.

In an embodiment, an interface between the first conductive layer and the second conductive layer has an uneven portion.

In an embodiment, the uneven portion has a triangular-wave shape or a rounded-wave shape.

In an embodiment, an interface between an inner wall of the contact hole and the second conductive layer has an uneven portion.

In an embodiment, the uneven portion has a triangular-wave shape or a rounded-wave shape.

In an embodiment, a display device includes: a display panel; and a touch sensing unit disposed on the display panel. The touch sensing unit includes: a substrate; a touch electrode disposed in a touch sensor area of the substrate; and a touch signal line connected to the touch electrode and that extends to a touch peripheral area of the substrate. The (1-1)th touch signal line includes a first conductive layer disposed on the substrate, and a second conductive layer disposed on the first conductive layer with an insulating layer interposed therebetween. The second conductive layer is in contact with the first conductive layer through a contact hole in the insulating layer. The first conductive layer includes at least one of Mo, MoNb, Ti or Ta, and the second conductive layer includes at least one of Al or AlNb.

In an embodiment, the first conductive layer of the touch signal line is made of a same material as a connection electrode disposed on the touch sensor area.

In an embodiment, the first conductive layer is disposed on a same layer as the connection electrode.

In an embodiment, the second conductive layer is disposed on a same layer as the touch electrode.

In an embodiment, the touch signal line further includes a third conductive layer disposed on the second conductive layer. The third conductive layer is in contact with the second conductive layer.

In an embodiment, a manufacturing method of a touch sensor unit includes: preparing a substrate; and forming a touch signal line on the substrate. Forming the touch signal line includes: forming a first conductive layer on the substrate; forming an insulating layer on the first conductive layer; forming a contact hole in the insulating layer, wherein contact hole exposes at least a portion of the first conductive layer; and forming a second conductive layer on the insulating layer, wherein the second conductive layer is in is contact with the first conductive layer through the contact hole. The first conductive layer includes at least one of Mo, MoNb, Ti or Ta, and the second conductive layer includes at least one of Al or AlNb.

In an embodiment, forming the touch signal line further includes forming a third conductive layer on the second conductive layer. The third conductive layer is in contact with the second conductive layer.

The touch sensing unit, the display device and a manufacturing method thereof according to the present disclosure provide the following effects.

First, since a second conductive layer made of AlNb is manufactured after a first conductive layer made of MoNb, the first conductive layer and the second conductive layer are in contact with each other before an oxide layer can form on the first conductive layer. Therefore, a contact defect between the first conductive layer and the second conductive layer can be minimized, and signal transmission capability of a touch signal line is increased.

Second, since no separate process, such as a dry etching process, is needed to remove the oxide layer, manufacturing costs can be reduced.

Third, since a plurality of conductive layers are vertically connected to each other through a contact hole, an area of the second conductive layer is increased by an inner area of the contact hole. Therefore, resistance of the touch signal line, which includes the first conductive layer and the second conductive layer, can be reduced.

Fourth, since the plurality of conductive layers are vertically stacked through the contact hole, space utilization in a horizontal direction is increased, so that a larger number of touch signal lines can be disposed in a narrow space.

BRIEF DESCRIPTION OF THE DRAWINGS

FIG. 1 is a perspective view of a display device according to an embodiment.

FIG. 4 is a detailed plan view of a display unit of FIG. 3.

FIG. 6 is an enlarged plan view of an area A of FIG. 5.

FIGS. 15 to 19 illustrate a manufacturing method of a display device that includes a touch sensing unit, according to an embodiment of the present disclosure.

FIG. 20 is a perspective view of a display device according to an embodiment.

DETAILED DESCRIPTION

Embodiments of the present disclosure will now be described more fully hereinafter with reference to the accompanying drawings, in which embodiments of the disclosure are shown. This disclosure may, however, be embodied in different forms and should not be construed as limited to embodiments set forth herein.

It will also be understood that when a layer is referred to as being "on" another layer or substrate, it can be directly on the other layer or substrate, or intervening layers may also be present. The same reference numbers may indicate the same components throughout the specification.

Each of the features of the various embodiments of the present disclosure may be combined or combined with each other, in part or in whole, and technically various interlocking and driving are possible. Each embodiment may be implemented independently of each other or may be implemented together in an association.

It will be understood that when an element is referred to as being "connected" or "coupled" to another element, it can be directly connected or coupled to the element or intervening elements may be present. In contrast, when an element is referred to as being "directly connected" or "directly coupled" to another element, there are no intervening elements present.

Hereinafter, a touch sensing unit, a display device and a manufacturing method thereof according to the embodiments of the present disclosure will be described in detail with reference to FIGS. 1 to 24.

Figure 1:
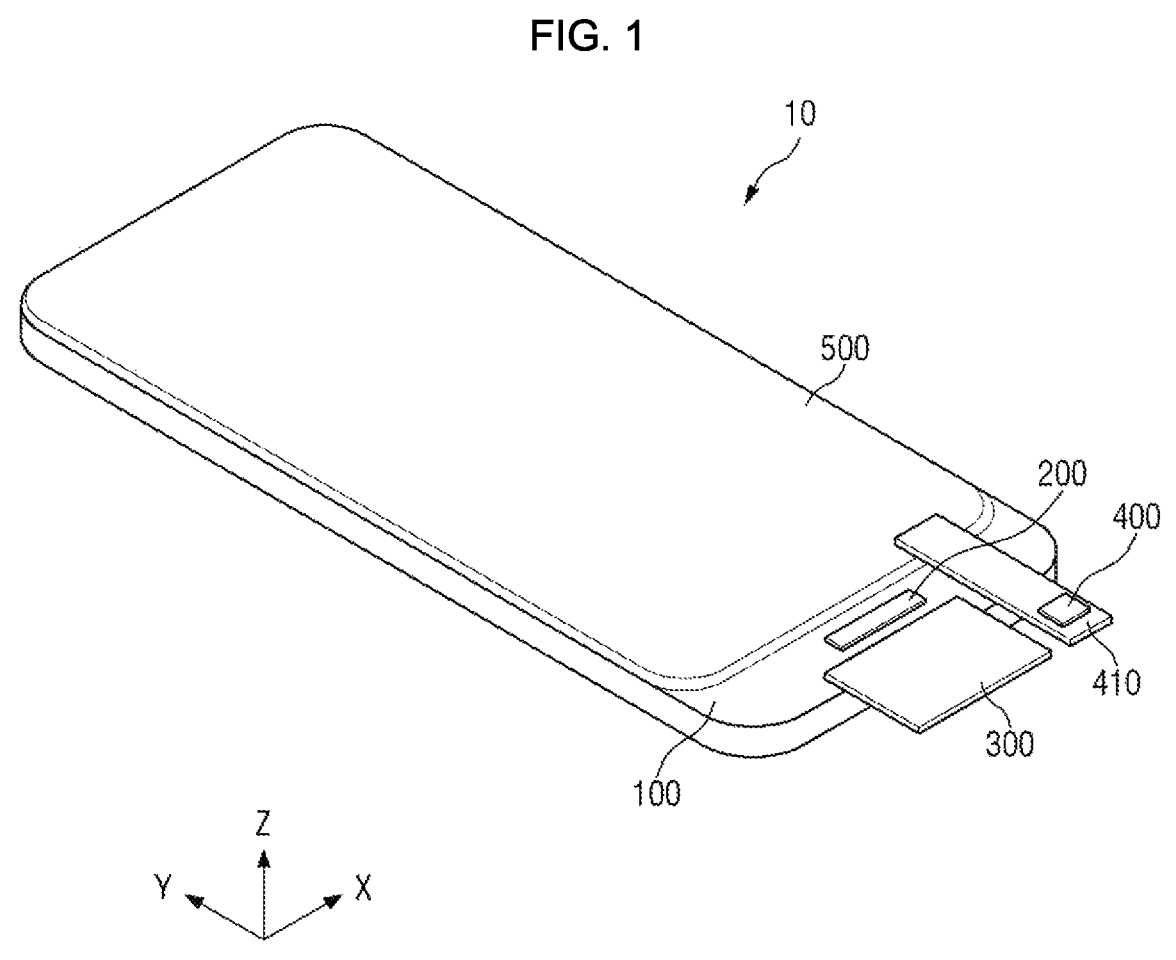
Figure 2:
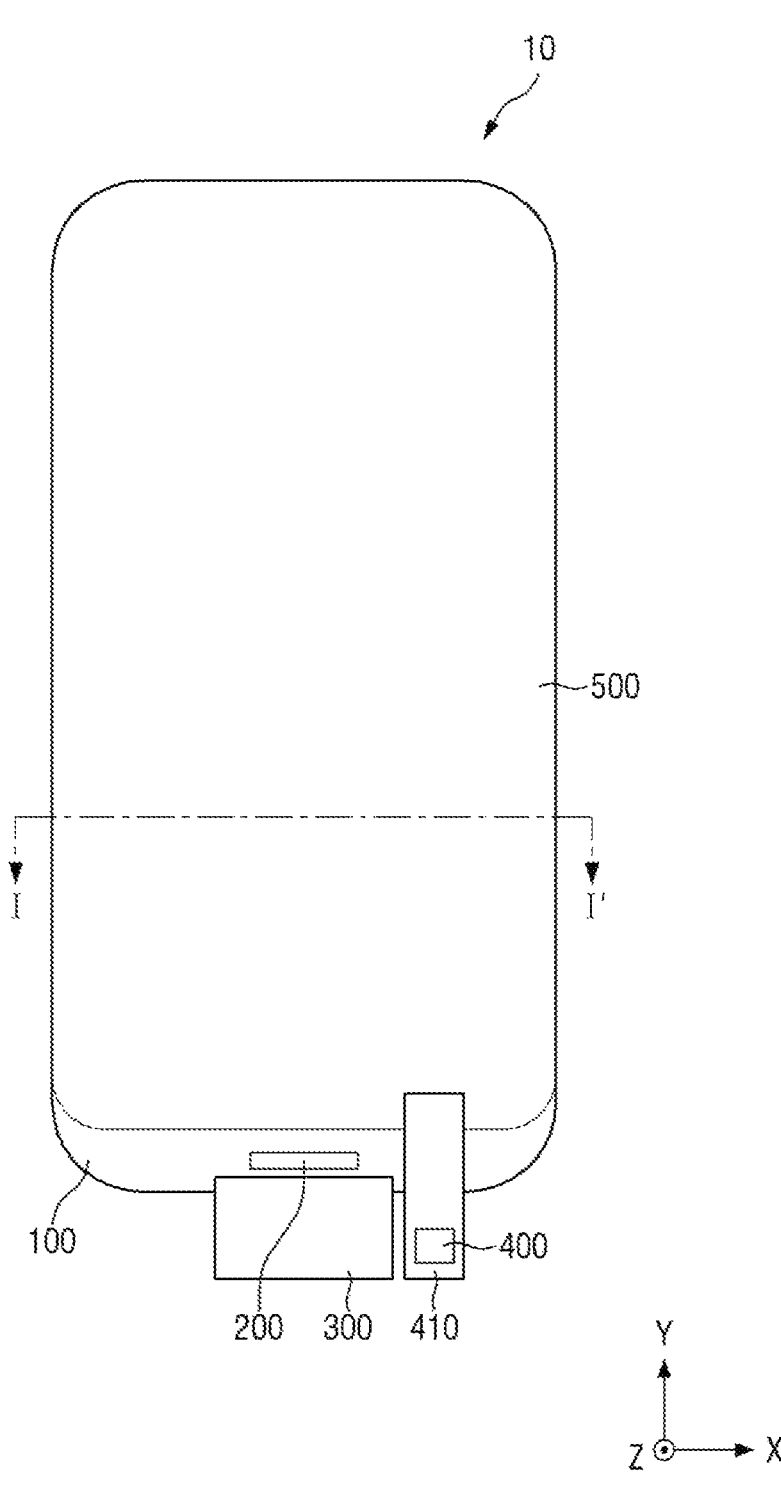
FIG. 2 is a plan view of a display device according to an embodiment.

FIG. 1 is a perspective view of a display device according to an embodiment. FIG. 2 is a plan view of a display device according to an embodiment.

In the present disclosure, "upper portion", "top" and "upper surface" refer to a direction in which a touch sensing unit 500 is disposed based on a display panel 100, that is, Z-axis direction, and "lower portion", "bottom" and "lower surface" refer to a direction in which the display panel 100 is disposed based on the touch sensing unit 500, that is, an opposite direction of the Z-axis direction. In addition, "left", "right", "upper" and "lower" refer to a direction when the display panel 100 is viewed on a plane. For example, "left" refers to an opposite direction of X-axis direction, "right"

refers to the X-axis direction, "upper" refers to Y-axis direction, and "lower" refers to an opposite direction of the Y-axis direction.

Referring to FIGS. 1 and 2, in an embodiment, the display device 10 can display a moving image or a still image. The display device 10 may be used as a display screen for various products, such as a television, a laptop computer, a monitor, a billboard, or an Internet of things (IoT) device, as well as portable electronic devices such as a mobile phone, a smart phone, a tablet personal computer (PC), a smart watch, a watch phone, a mobile communication terminal, an electronic diary, an electronic book, a portable multimedia player (PMP), a navigator and an ultra mobile (UMPC). The display device may be one of an organic light emitting display device, a liquid crystal display device, a plasma display device, a field emission display device, an electrophoretic display device, an electrowetting display device, a quantum dot light emitting display device, or a micro-LED display device. Hereinafter, an organic light emitting display device will be described as the display device 10, but embodiments of the present disclosure are not necessarily limited thereto.

The display device 10 according to an embodiment includes a display panel 100, a display driving circuit 200, a display circuit board 300, a touch driving circuit 400, a touch circuit board 410, and a touch sensing unit 500.

The display panel 100 has a rectangular shape that has short sides in a first direction (X-axis direction) and long sides in a second direction (Y-axis direction) that crosses the first direction (X-axis direction). A corner where the short side in the first direction (X-axis direction) and the long side in the second direction (Y-axis direction) meet may be rounded to have a predetermined curvature, or may form a right angle. The planar shape of the display panel 100 is not necessarily limited to a rectangle, and may have other shapes, such as a polygonal shape, a circular shape or an oval shape.

In an embodiment, the display panel 100 is flat, but embodiments are not necessarily limited thereto, and on other embodiments, include a curved portion formed at left and/or right ends. For example, the curved portion may have a predetermined curvature or a changing curvature. In addition, in an embodiment, the display panel 100 is flexible, so that it can be bent, curved, folded or rolled.

The display panel 100 includes pixels disposed in a display area that display an image, and display electrode pads disposed in a non-display area adjacent to the display area. The display electrode pads are formed on one edge of the display panel 100 and electrically connected to the display circuit board 300. A detailed description of the display panel 100 will be described below with reference to FIGS. 3 and 5.

The display driving circuit 200 outputs signals and voltages that drive the display panel 100. For example, the display driving circuit 200 supplies data voltages to data lines. In addition, the display driving circuit 200 supplies a power voltage to a power line and supplies scan control signals to a scan driver. The display driving circuit 200 is an integrated circuit (IC) that is bonded onto the display panel 100 by one of a chip on glass (COG) method, a chip on plastic (COP) method, or an ultrasonic bonding method. In an embodiment, the display driving circuit 200 is bonded to the display panel 100 and exposed without being covered by the touch sensing unit 500. In an embodiment, the display driving circuit 200 is mounted on the circuit board 300.

The display circuit board 300 is attached onto the display electrode pads of the display panel 100 by using an anisotropic conductive film. For this reason, lead lines of the display circuit board 300 are electrically connected to the display electrode pads of the display panel 100. The display circuit board 300 may be a flexible film such as a flexible printed circuit board, a printed circuit board, or a chip on film.

The touch sensing unit 500 is disposed on the display panel 100. The touch sensing unit 500 has a rectangular shape that has short sides in the first direction (X-axis direction) and long sides in the second direction (Y-axis direction). A corner where the short side in the first direction (X-axis direction) and the long side in the second direction (Y-axis direction) meet may be rounded to have a predetermined curvature, or may form a right angle. However, the planar shape of the touch sensing unit 500 is not necessarily limited to a rectangle, and may have other shapes, such as polygonal shape, a circular shape or an oval shape. The planar shape of the touch sensing unit 500 is similar to that of the display panel 100.

In an embodiment, the touch sensing unit 500 is flat, but embodiments are not necessarily limited thereto, and in other embodiments, include a curved portion formed at left and/or right ends. For example, the curved portion may have a predetermined curvature or a changing curvature. In addition, in an embodiment, the touch sensing unit 500 is flexible so that it can be bent, curved, folded or rolled, like the display panel 100.

The touch sensing unit 500 includes touch electrodes disposed in a touch sensor area that sense a user's touch and touch electrode pads TP disposed in a touch peripheral area disposed near the touch sensor area. The touch electrode pads TP are formed on the touch sensing unit 500 at one edge of the touch sensing unit 500 and electrically connected to the touch circuit board 410.

Figure 21:
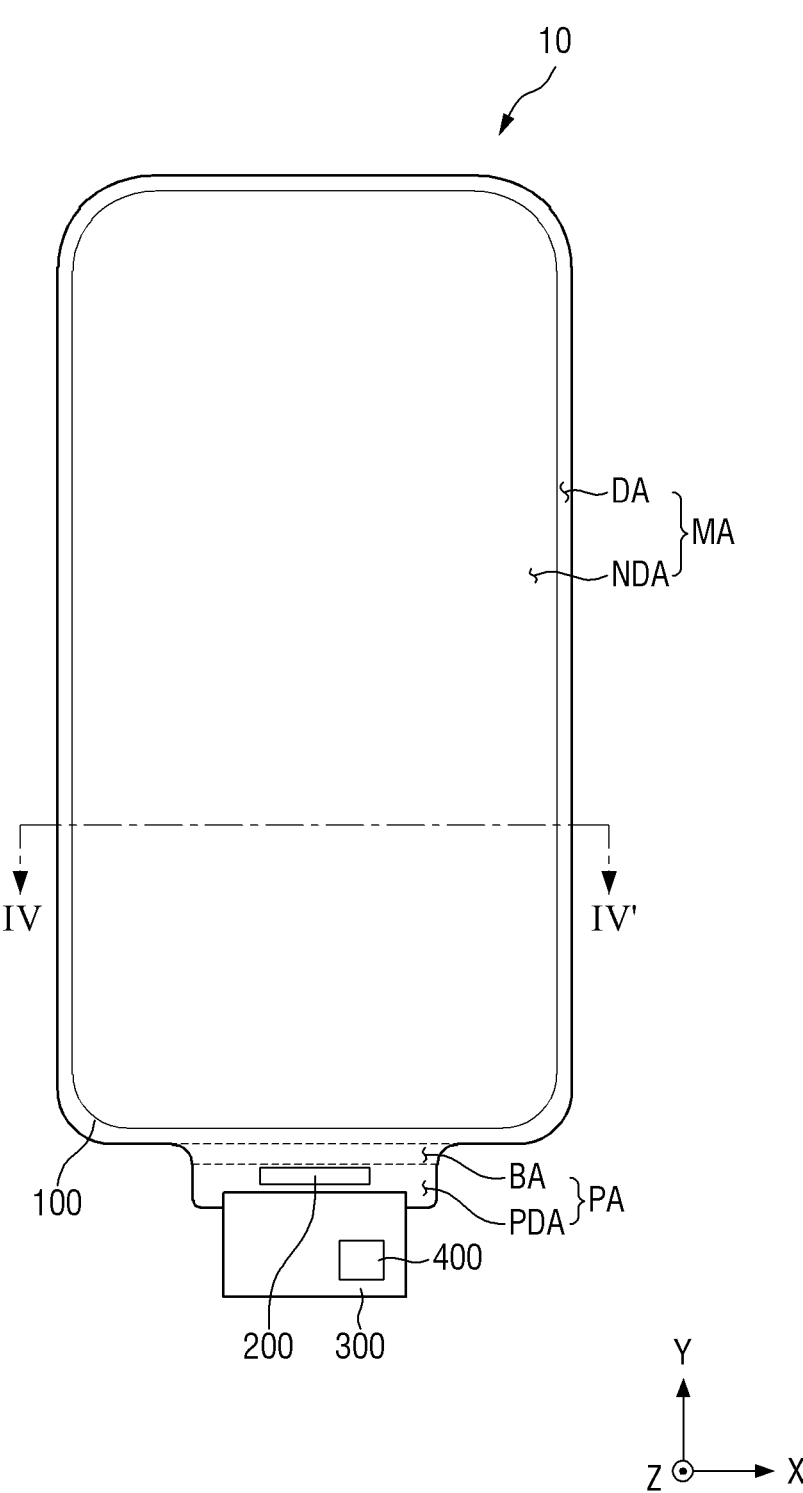
FIG. 21 is a plan view of a display device according to an embodiment.
Figure 22:
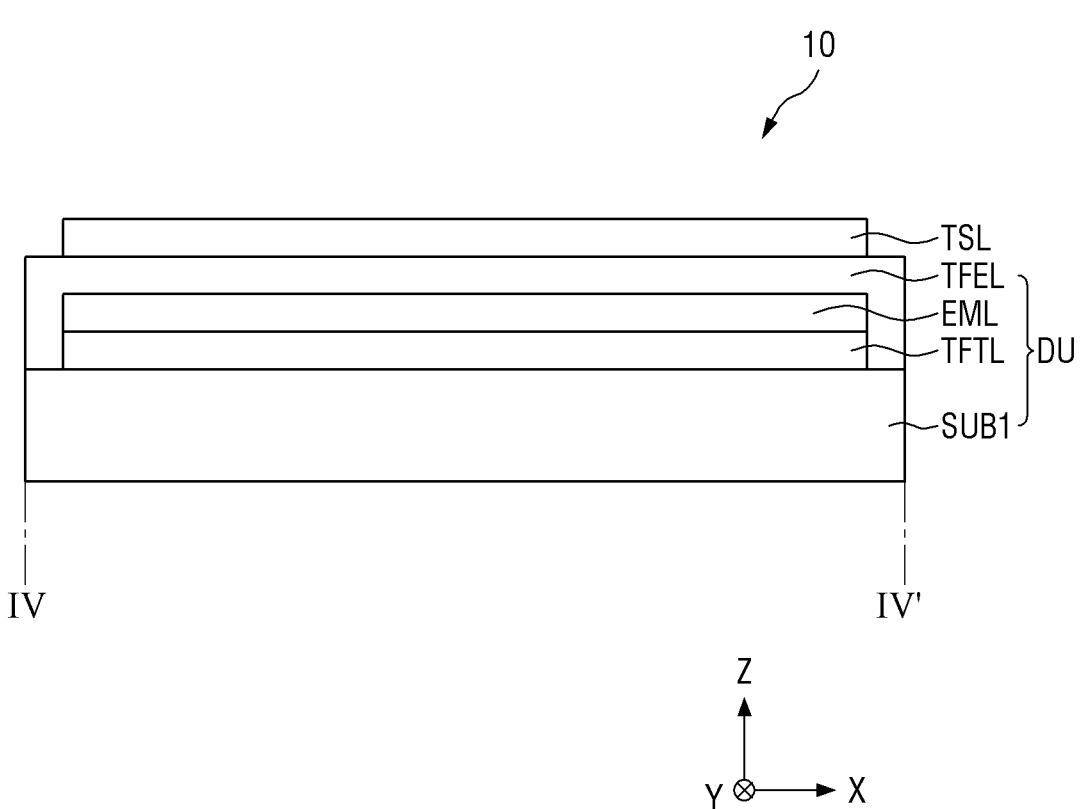
FIG. 22 is a cross-sectional view taken along line IV-IV' of FIG. 21.

The touch sensing unit 500 will be described in detail with reference to FIGS. 3 and 5. In addition, although FIGS. 1 and 2 show that the touch sensing unit 500 is separate from the display panel 100, embodiments of the present disclosure are not necessarily limited thereto. For example, as shown in FIGS. 21 and 22, the touch sensing unit 500 can be directly formed on a thin film encapsulation layer TFEL of the display panel 100.

The touch circuit board 410 is attached onto the touch electrode pads of the touch sensing unit 500 by using an anisotropic conductive film. Therefore, lead lines of the touch circuit board 410 are electrically connected to the touch electrode pads of the touch sensing unit 500. The touch circuit board 410 may be one of a flexible film such as a flexible printed circuit board, a printed circuit board, or a chip on film.

The touch driving circuit 400 is connected to the touch electrodes of the touch sensing unit 500. The touch driving circuit 400 transmits touch driving signals to the touch electrodes of the touch sensing unit 500 and measures capacitance values of the touch electrodes. The touch drive signal has a plurality of drive pulses. The touch driving circuit 400 determines whether a touch has occurred based on the capacitance values, and calculates touch coordinates where a touch has occurred. The touch driving circuit 400 is an integrated circuit (IC) and mounted on the touch circuit board 300.

Figure 3:
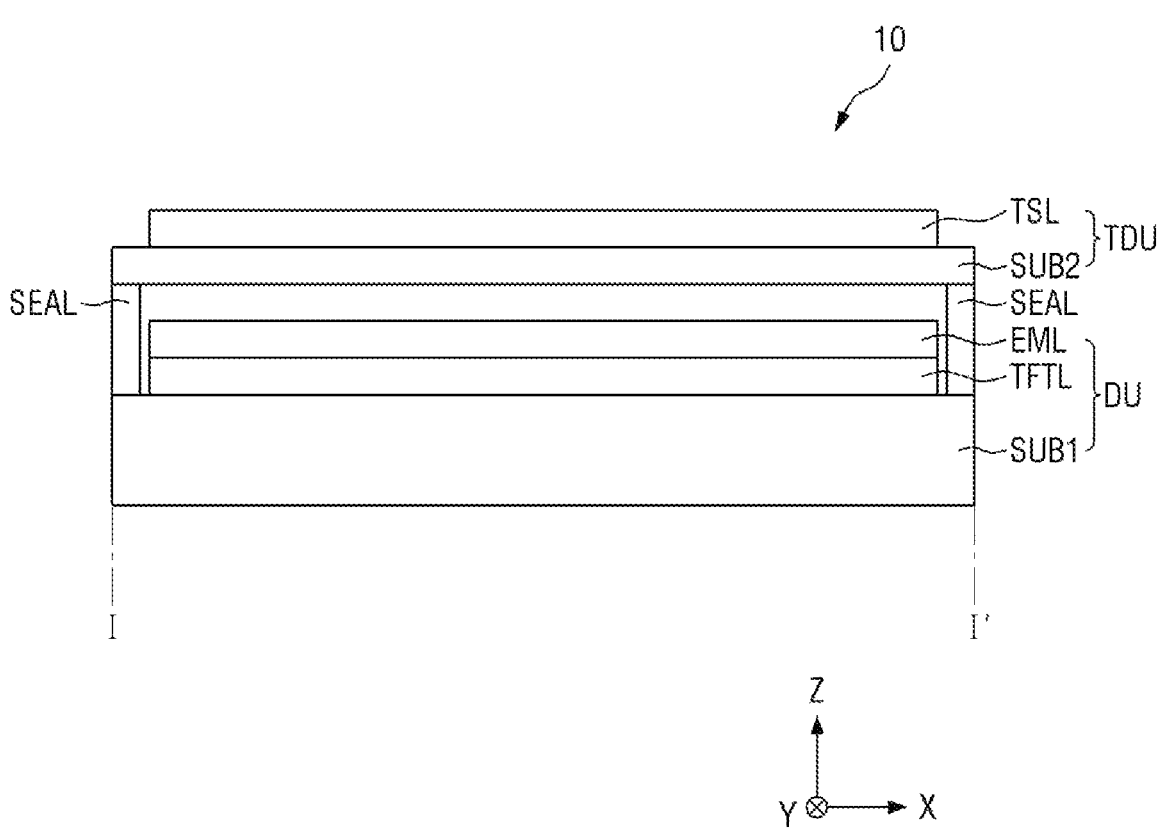
FIG. 3 is a cross-sectional view taken along line I-I' of FIG. 2.

FIG. 3 is a cross-sectional view taken along line I-I of FIG. 2.

Referring to FIG. 3, in an embodiment, the display device 10 includes a display unit DU, a touch sensing unit TDU and an adhesive member SEAL that bonds the display unit DU to the touch sensing unit TDU.

The display unit DU includes a first substrate SUB1, a thin film transistor layer TFTL, and a light emitting element layer EML.

The first substrate SUB1 may be a rigid substrate, or may be a flexible substrate that can be bent, folded, rolled, etc. The first substrate SUB1 is made of an insulating material such as glass, quartz or a polymer resin. Examples of the polymer material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or their combination. Alternatively, the first substrate SUB1 includes a metal.

Figure 4:
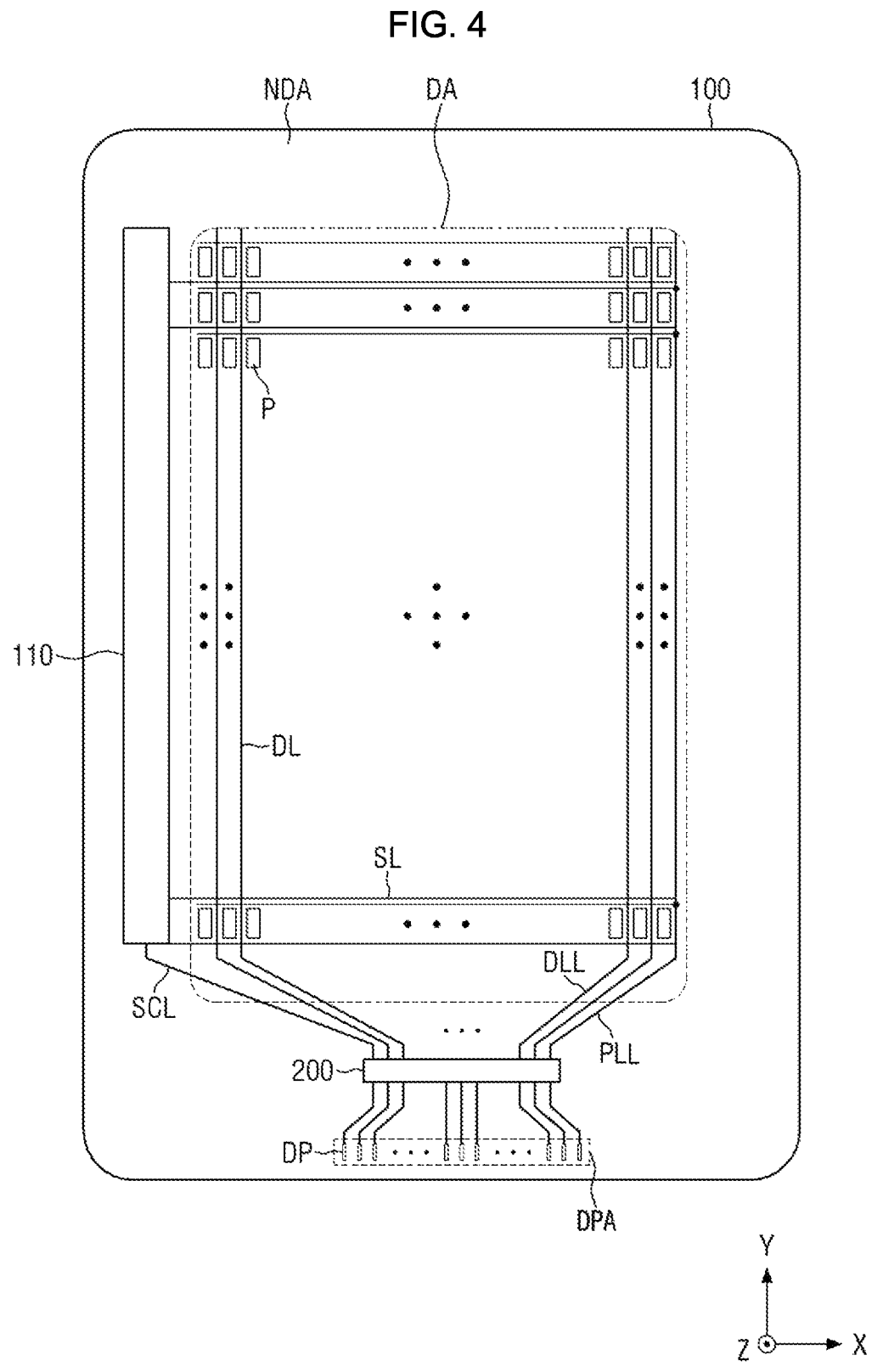

The thin film transistor layer TFTL is disposed on the first substrate SUB1. Scan lines, data lines, power lines, scan control lines, data connection lines that connect the display driving circuit 200 with the data lines and pad connection lines that connect the display driving circuit 200 with the display electrode pads as well as thin film transistors of respective pixels are formed in the thin film transistor layer TFTL. Each of the thin film transistors includes a gate electrode, a semiconductor layer, a source electrode and a drain electrode. When a scan driver 110 is formed in a non-display area NDA of the display panel 100 as shown in FIG. 4, the scan driver 110 includes thin film transistors.

The thin film transistor layer TFTL is disposed in a display area DA and the non-display area NDA. For example, the thin film transistors of the respective pixels, the scan lines, the data lines and the power lines of the thin film transistor layer TFTL are disposed in the display area DA. The scan control lines, the data connection lines and the pad connection lines of the thin film transistor layer TFTL are disposed in the non-display area NDA.

The light emitting element layer EML is disposed on the thin film transistor layer TFTL. The light emitting element layer EML includes pixels in which a first electrode, a light emitting layer and a second electrode are sequentially stacked to emit light, and a pixel defining layer that defines the pixels. The pixels of the light emitting element layer EML are disposed in the display area DA.

The light emitting layer may be an organic light emitting layer that includes an organic material. For example, the light emitting layer includes a hole transporting layer, an organic light emitting layer and an electron transporting layer. When a predetermined voltage is applied to the first electrode through the thin film transistor of the thin film transistor layer TFTL and a cathode voltage is applied to the second electrode, holes and electrons move to the organic light emitting layer through the hole transport layer and the electron transporting layer, respectively, and combine with each other in the organic light emitting layer to emit light. For example, the first electrode is an anode electrode, and the second electrode is a cathode electrode.

The touch sensing unit TDU includes a second substrate SUB2 and a touch sensor layer TSL.

The second substrate SUB2 may be a rigid substrate, or may be a flexible substrate that can be bent, folded, rolled, etc. The second substrate SUB2 is made of an insulating material such as glass, quartz or a polymer resin. Examples of the polymer material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or their combination. Alternatively, the second substrate SUB2 includes a metal. The second substrate SUB2 is an encapsulation substrate that encapsulates the light emitting element layer EML.

The touch sensor layer TSL is disposed on the second substrate SUB2. The touch sensor layer TSL includes touch electrodes that sense a user's touch in a capacitance manner, touch electrode pads, and touch signal lines that connect the touch electrode pads with the touch electrodes. For example, the touch sensor layer TSL may sense a user's touch in a self-capacitance manner or a mutual capacitance manner.

Figure 5:
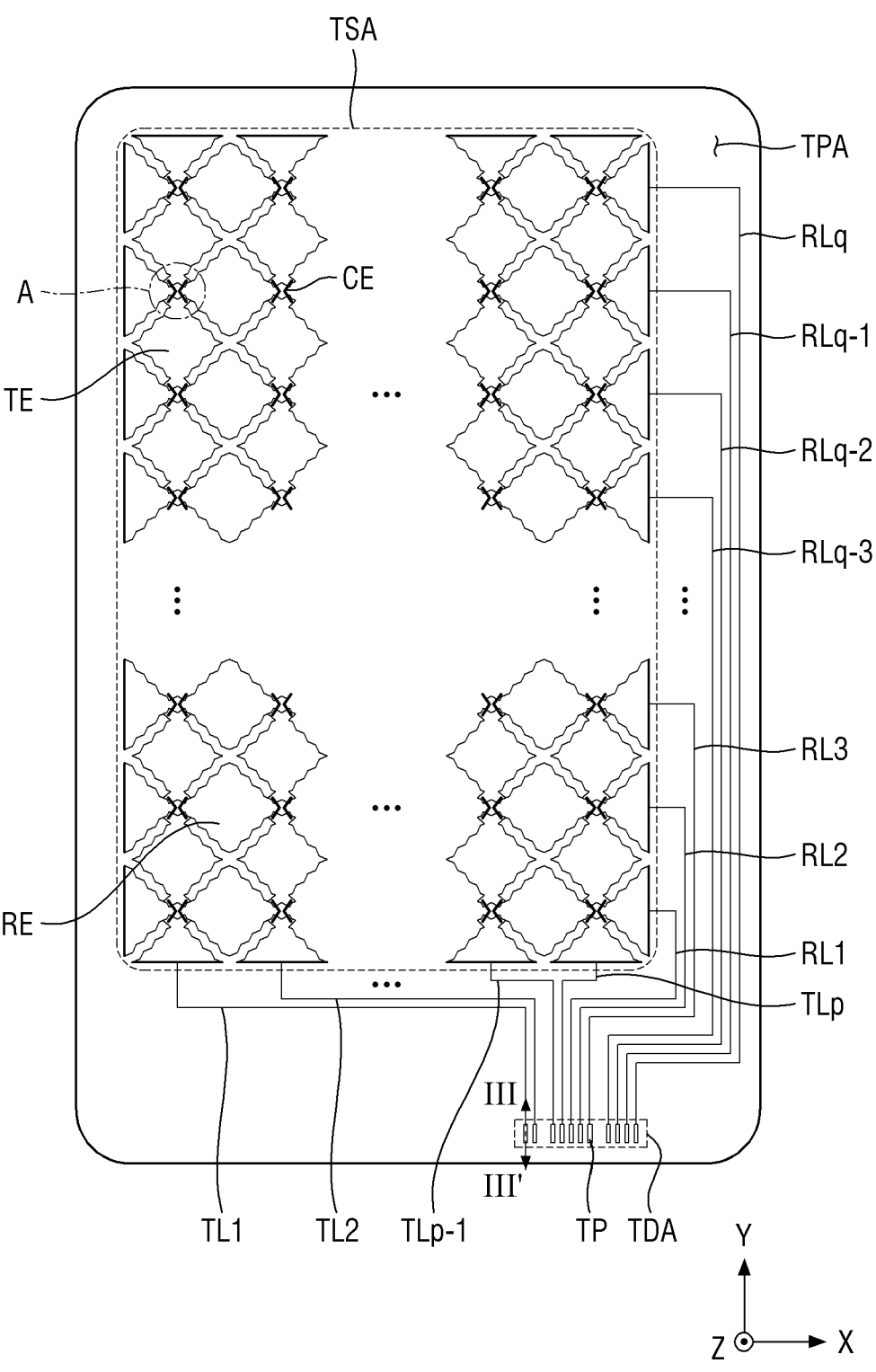
FIG. 5 is a detailed plan view of a touch sensing unit of FIG. 3.

As shown in FIG. 5, the touch electrodes of the touch sensor layer TSL are disposed in a touch sensor area TSA that overlaps the display area DA. The touch signal lines and the touch electrode pads TP of the touch sensor layer TSL are disposed in a touch peripheral area TPA that overlaps the non-display area NDA. The touch peripheral area TPA is disposed adjacent to the touch sensor area TSA.

A polarizing film and a cover window may be additionally disposed on the touch sensor layer TSL. For example, the polarizing film is disposed on the touch sensor layer TSL, and the cover window is attached onto the polarizing film by a transparent adhesive member.

The adhesive member SEAL bonds the first substrate SUB1 of the display unit DU to the second substrate SUB2 of the touch sensing unit TDU. The adhesive member SEAL may be one of a frit adhesive layer, an ultraviolet curable resin or a thermosetting resin, but is not necessarily limited thereto.

Although FIG. 3 shows that an empty space is present between the light emitting element layer EML and the second substrate SUB2, embodiments of the present disclosure are not necessarily limited thereto. For example, in an embodiment, a filling film is disposed between the light emitting element layer EML and the second substrate SUB2. The filling film may be an epoxy filling film or a silicon filling film.

FIG. 4 is a detailed plan view of the display unit DU of FIG. 3. For convenience of illustration, the pixels P of a display unit DU, the scan lines SL, the data lines DL, a power line PL, the scan control lines SCL, a scan driver 110, a display driving circuit 200, the display electrode pads DP, the data connection lines DLL and pad connection lines PLL are shown only in FIG. 4.

Referring to FIG. 4, in an embodiment, the display panel 100 includes a display area DA in which pixels that display an image are disposed, and a non-display area NDA that is a peripheral area of the display area DA. The non-display area NDA is outside of the display area DA and extends to the edge of the display panel 100.

The scan lines SL, the data lines DL, the power line PL and the pixels P are disposed in the display area DA. The scan lines SL extend parallel in a first direction (X-axis direction), and the data lines DL extend parallel in a second direction (Y-axis direction) that crosses the first direction (X-axis direction). The power line PL includes at least one line that extends parallel with data lines DL in the second direction (Y-axis direction) and a plurality of lines that diverge in the first direction (X-axis direction) from the at least one line.

Each of the pixels P is connected to at least one of the scan lines SL, one of the data lines DL and the power line PL. Each of the pixels P includes thin film transistors that include a driving transistor and at least one switching transistor, an organic light emitting diode, and a capacitor. Each of the pixels P receives a data voltage from the data line DL when a scan signal is received from the scan line SL and supplies a driving current to the organic light emitting diode in accordance with a data voltage applied to the gate electrode, thereby emitting light.

The scan driver 110, the display driving circuit 200, the scan control line SCL, the data connection lines DLL and the pad connection lines PLL are disposed in the non-display area NDA.

The scan driver 110 is connected to the display driving circuit 200 through at least one scan control line SCL. Therefore, the scan driver 110 receives the scan control signal of the display driving circuit 200. The scan driver 110 generates scan signals in accordance with the scan control signal and supplies the scan signals to the scan lines SL.

Although FIG. 4 shows that the scan driver 110 is formed in the non-display area NDA on one side of the display area DA, embodiments of the present disclosure are not necessarily limited thereto. For example, in an embodiment, the scan driver 110 is formed in the non-display area NDA on both sides of the display area DA.

The display driving circuit 200 is connected to the display electrode pads DP of a display pad area DPA through the display connection lines PLL to receive digital video data and timing signals. The display driving circuit 200 converts the digital video data into analog positive/negative data voltages and supplies the analog positive/negative data voltages to the data lines DL through the data connection lines DLL. In addition, the display driving circuit 200 generates and supplies the scan control signal that controls the scan driver 110 through the scan control line SCL. Pixels to which data voltages are supplied are selected by the scan signals of the scan driver 110, and the data voltages are supplied to the selected pixels P. The display driving circuit 200 is an integrated circuit (IC) that is attached onto a substrate SUB in one of a chip on glass (COG) method, a chip on plastic (COP) method or an ultrasonic bonding method.

FIG. 5 is a detailed plan view of the touch sensing unit TDU of FIG. 3.

Referring to FIG. 5, in an embodiment, the touch sensing unit TDU includes a touch sensor area TSA that senses a user's touch and a touch peripheral area TPA adjacent to the touch sensor area TSA. The touch sensor area TSA overlaps the display area DA of the display unit DU, and the touch peripheral area TPA overlaps the non-display area NDA of the display unit DU.

The touch sensor area TSA has a rectangular shape in a plan view.

First touch electrodes TE and second touch electrodes RE are disposed in the touch sensor area TSA. The first touch electrodes TE and the second touch electrodes RE are spaced apart from each other. The first touch electrodes TE are disposed in a plurality of columns that extend in the second direction (Y-axis direction), and the second touch electrodes RE are disposed in a plurality of rows that extend in the first direction (X-axis direction). The first touch electrodes TE disposed in each of the plurality of columns are electrically connected to each other. In addition, the second touch electrodes RE disposed in each of the plurality of rows are electrically connected to each other.

The first touch electrodes TE and the second touch electrodes RE are disposed in each of a first touch sensor area, a second touch sensor area and a third touch sensor area. The first touch electrodes TE and the second touch electrodes RE that are disposed in the first touch sensor area have a diamond shape or a triangular shape in a plan view. For example, the first touch electrodes TE and the second touch electrodes RE that are disposed at the edge of the first touch sensor area have a triangular shape in a plan view, and the other first touch electrodes TE and the other second touch electrodes RE have a diamond shape in a plan view. In each of the second touch sensor area and the third touch sensor area, at least one first touch electrode TE and at least one second touch electrode RE has an atypical shape. In addition, to prevent a moire phenomenon from occurring due to the first touch electrodes TE and the second touch electrodes RE when the image of the display device 10 is viewed, the first touch electrodes TE and the second touch electrodes RE have concave and convex sides in a plan view. However, the planar shapes of the first touch electrodes TE and the second touch electrodes RE that are disposed in the touch sensor area TSA are not necessarily limited to those shown in FIG. 5.

The first touch electrodes TE adjacent to each other in the second direction (Y-axis direction) are electrically connected to each other through a connection electrode CE to prevent the first touch electrodes TE and the second touch electrodes RE from being short-circuited in their crossing areas. For example, the first touch electrodes TE and the second touch electrodes RE are disposed on one layer, and the connection electrode CE is disposed on a different layer from the first touch electrodes TE and the second touch electrodes RE. Therefore, the first touch electrodes TE electrically connected in the second direction (Y-axis direction) and the second touch electrodes RE electrically connected in the first direction (X-axis direction) are electrically insulated from each other.

First touch signal lines TL1 to TLp (p is a positive integer equal to or greater than 2), second touch signal lines RL1 to RLq (q is a positive integer equal to or greater than 2) and touch electrode pads TP are disposed in the touch peripheral area TPA.

One end of each of the first touch signal lines TL1 to TLp is connected to the first touch electrodes TE on a first side of the touch sensor area TSA. The first side of the touch sensor area TSA is closest to a touch pad area TDA where the touch electrode pads TP are disposed, of the four sides of the touch sensor area TSA. The second side of the touch sensor area TSA faces the first side, and the third side and the fourth side of the touch sensor area TSA are located between the first side and the second side. For example, the third side is where the aforementioned second touch signal lines RL1 to RLq are disposed, and the fourth side faces the third side. The other end of each of the first touch signal lines TL1 to TLp is connected to some of the touch electrode pads TP of the touch pad area TDA. For example, the first touch signal lines TL1 to TLq connect the first touch electrodes TE on the first side of the touch sensor area TSA with some of the touch electrode pads TP of the touch pad area TDA.

For example, as shown in FIG. 5, a (1-1)th touch signal line TL1 is electrically connected to the first touch electrodes TE in a first column of the touch sensor area TSA, and a (1-2)th touch signal line TL2 is electrically connected to the first touch electrodes TE in a second column of the touch sensor area TSA. In addition, a (1–p)th touch signal line TLp–1 is electrically connected to the first touch electrodes TE in a (p–1)th column of the touch sensor area TSA, and a (p)th touch signal line TLp is electrically connected to the first touch electrodes TE in a (p)th column of the touch sensor area TSA. For example, the first column of the touch sensor area TSA is disposed at the leftmost side of the touch sensor area TSA, and the (p)th column of the touch sensor area TSA is disposed at the rightmost side of the touch sensor area TSA.

One end of each of the second touch signal lines RL1 to RLq is connected to the second touch electrodes RE on a third side of the touch sensor area TSA. The other end of each of the second touch signal lines RL1 to RLq is connected to the other touch electrode pads TP of the touch pad area TDA. For example, the second touch signal lines RL1 to RLq connect the second touch electrodes RE on the third side of the touch sensor area TSA with the other touch electrode pads TP of the touch pad area TDA.

For example, as shown in FIG. 5, a (2-1)th touch signal line RL1 is electrically connected to the second touch electrodes RE in a first row of the touch sensor area TSA, a (2-2)th touch signal line RL2 is electrically connected to the second touch electrodes RE in a second row of the touch sensor area TSA, and a (2-3)th touch signal line RL3 is electrically connected to the second touch electrodes RE in a third row of the touch sensor area TSA. In addition, a (2-q)th touch signal line RLq−2 is electrically connected to the second touch electrodes RE in a (q−2)th row of the touch sensor area TSA, a (2−(q−1))th touch signal line RLq−1 is electrically connected to the second touch electrodes RE in a (q−1)th row of the touch sensor area TSA, and a (q)th touch signal line RLq is electrically connected to the second touch electrodes RE in a (q)th row of the touch sensor area TSA.

The touch electrode pads TP are disposed on one side of the second substrate SUB2. The touch circuit board 410 is attached onto the touch electrode pads TP by using an anisotropic conductive film. As a result, the touch electrode pads TP are electrically connected to the touch circuit board 410.

The first touch electrodes TE and the second touch electrodes RE may be driven in a mutual capacitance manner or a self-capacitance manner.

When the first touch electrodes TE and the second touch electrodes RE are driven in a mutual capacitance manner, the touch driving signals are supplied to the first touch electrodes TE through the first touch signal lines TL1 to TLp to charge mutual capacitances formed at crossing areas of the first touch electrodes TE and the second touch electrodes RE. Then, the charge change amounts of the mutual capacitances are measured through the second touch electrodes RE, and a touch input is determined depending on the charge change amounts of the mutual capacitances. The touch drive signal has a plurality of touch drive pulses.

When the first touch electrodes TE and the second touch electrodes RE are driven in a self-capacitance manner, the touch driving signals are supplied to both the first touch electrodes TE and the second touch electrodes RE through the first touch signal lines TL1 to TLp and the second touch signal lines RL1 to RLq, so that self-capacitances of the first touch electrodes TE and the second touch electrodes RE are charged. Then, the charge change amounts of the self-capacitances are measured through the first touch signal lines TL1 to TLp and the second touch signal lines RL1 to RLq, and the touch input is determined based on the charge change amounts of the self-capacitances.

Hereinafter, for convenience of description, the following description will be based on that a plurality of touch driving pulses are supplied to the first touch electrodes TE and the touch electrodes are driven in a mutual capacitance manner in which the charge change amounts of the mutual capacitances are measured through the second touch signal lines RL1 to RLq connected to the second touch electrodes RE. For example, the first touch electrodes TE function as touch driving electrodes, the second touch electrodes RE function as touch sensing electrodes, the first touch signal lines TL1 to TLp function as touch driving lines, and the second touch signal lines RL1 to RLq function as touch sensing lines.

Figure 6:
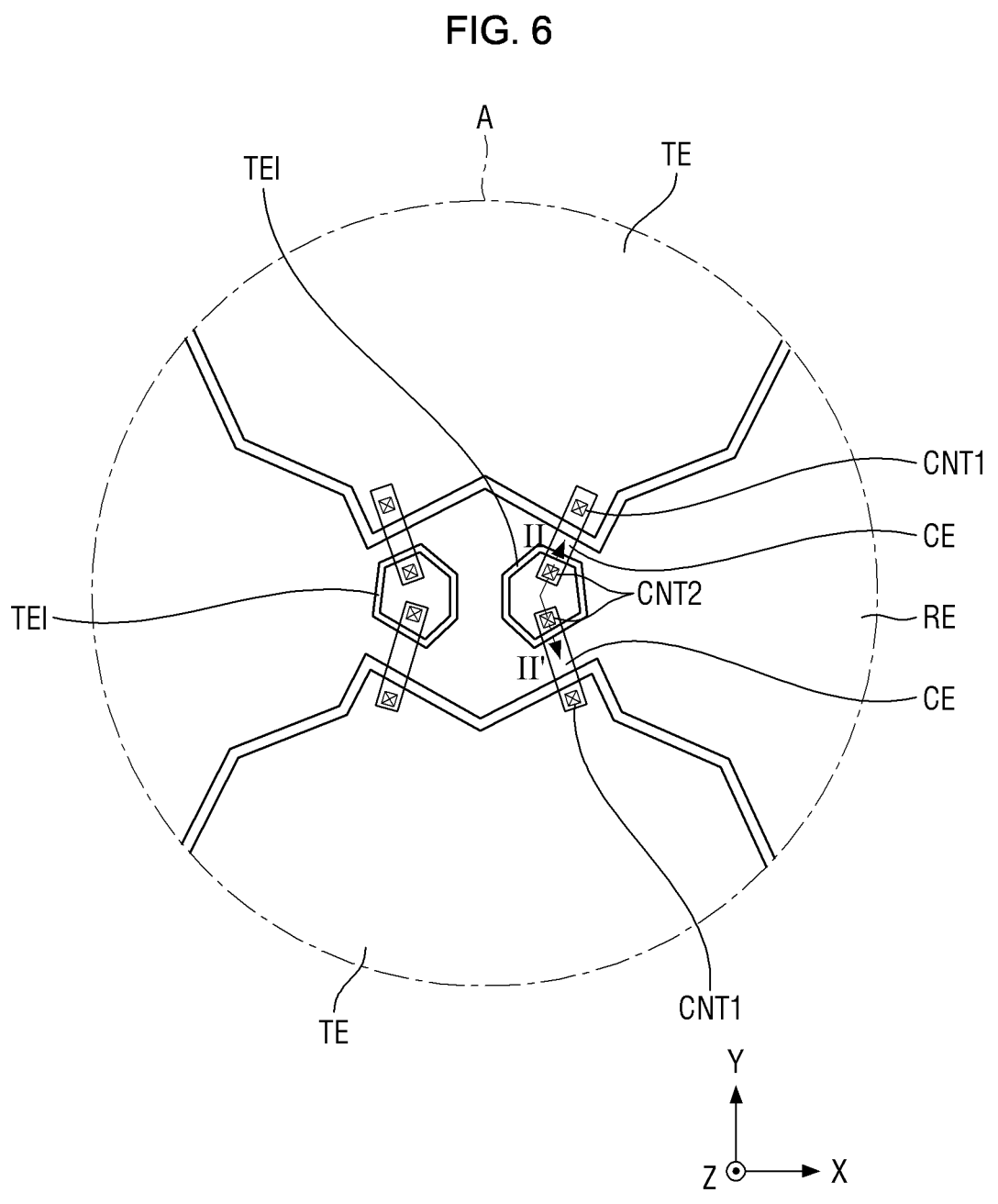
Figure 7:
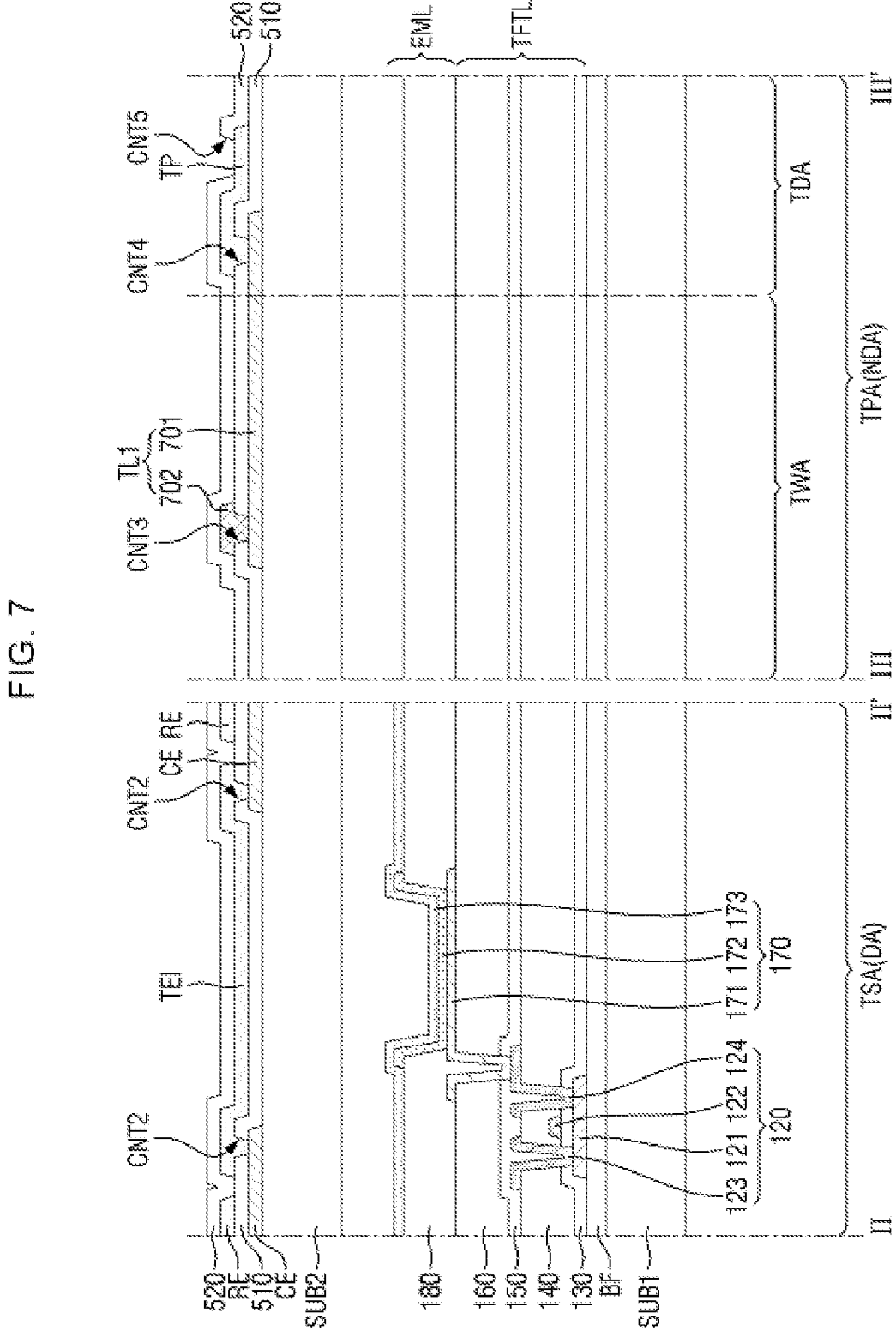
FIG. 7 is a cross-sectional view taken along lines II-II' of FIG. 6 and III-III' of FIG. 5.

FIG. 6 is an enlarged plan view of an area A of FIG. 5. FIG. 7 is a cross-sectional view taken along lines II-II' of FIG. 6 and III-III' of FIG. 5.

Referring to FIGS. 6 and 7, in an embodiment, the thin film transistor TFTL layer is formed on the first substrate SUB1. The thin film transistor layer TFTL includes thin film transistors 120, a gate insulating layer 130, an interlayer insulating layer 140, a passivation layer 150 and a planarization layer 160.

A buffer film BF is formed on one surface of the first substrate SUB1 and below the thin film transistor TFTL layer. The buffer film BF protects the thin film transistors 120 and an organic light emitting layer 172 of the light emitting element layer EML from moisture that permeates through the first substrate SUB1, which is vulnerable to moisture permeation. The buffer film BF includes a plurality of inorganic films that are alternately stacked. For example, the buffer film BF is a multi-layer film in which one or more inorganic films of a silicon nitride layer, a silicon oxynitride layer, a silicon oxide layer, a titanium oxide layer or an aluminum oxide layer are alternately stacked. The buffer film BF may be omitted.

The thin film transistor 120 is formed on the buffer film BF. The thin film transistor 120 includes an active layer 121, a gate electrode 122, a source electrode 123 and a drain electrode 124. Although FIG. 7 shows that the thin film transistor 120 is a top gate type in which the gate electrode 122 is disposed on the active layer 121, embodiments of the present disclosure are not necessarily limited thereto. For example, in some embodiments, the thin film transistor 120 is a bottom gate type in which the gate electrode 122 is positioned below the active layer 121, or a double gate type in which gate electrodes 122 are positioned on and below the active layer 121.

The active layer 121 is formed on the buffer film. The active layer 121 is an inorganic semiconductor such as polycrystalline silicon, monocrystalline silicon, low temperature polycrystalline silicon or amorphous silicon, or an oxide semiconductor. A light shielding layer that shields external light incident on the active layer 121 may be formed between the buffer film and the active layer 121.

The gate insulating layer 130 is formed on the buffer film BF and the active layer 121. The gate insulating layer 130 is an inorganic layer, such as one of a silicon nitride layer, a silicon oxynitride layer, a silicon oxide layer, a titanium oxide layer or an aluminum oxide layer.

The gate electrode 122 and a gate line are formed on the gate insulating layer 130. The gate electrode 122 and the gate line may be a single layer or multiple-layers formed from at least one of molybdenum (Mo), aluminum (Al), chromium (Cr), gold (Au), titanium (Ti), nickel (Ni), neodymium (Nd) or copper (Cu), or their alloy.

The interlayer insulating layer 140 is formed on the gate insulating layer 130 and the gate electrode 122 and the gate line. The interlayer insulating layer 140 is an inorganic layer, such as one of a silicon nitride layer, a silicon oxynitride layer, a silicon oxide layer, a titanium oxide layer or an aluminum oxide layer.

The source electrode 123 and the drain electrode 124 are formed on the interlayer insulating layer 140. Each of the source electrode 123 and the drain electrode 124 is connected to the active layer 121 through a contact hole that penetrates through the gate insulating layer 130 and the interlayer insulating layer 140. The source electrode 123 and the drain electrode 124 may be a single layer or multiple-layers formed from at least one of molybdenum (Mo), aluminum (Al), chromium (Cr), gold (Au), titanium (Ti), nickel (Ni), neodymium (Nd) or copper (Cu), or their alloy.

The passivation layer 150 that insulates the thin film transistor 120 may be formed on the interlayer insulating layer 140, the source electrode 123 and the drain electrode 124. The passivation layer 150 is formed of an inorganic layer, such as one of a silicon nitride layer, a silicon oxynitride layer, a silicon oxide layer, a titanium oxide layer or an aluminum oxide layer.

The planarization layer 160 that planarizing a step difference due to the thin film transistor 120 is formed on the passivation layer 150. The planarization layer 160 is formed of an organic layer, such as one of an acryl resin, an epoxy resin, a phenolic resin, a polyamide resin or a polyimide resin.

The light emitting element layer EML is formed on the thin film transistor layer TFTL. The light emitting element layer EML includes light emitting elements 170 and a pixel defining layer 180.

The light emitting elements 170 and the pixel defining layer 180 are formed on the planarization layer 160. Each of the light emitting elements 170 includes a first electrode 171, an organic light emitting layer 172 and a second electrode 173.

The first electrode 171 is formed on the planarization layer 160. The first electrode 171 is connected to the source electrode 123 of the thin film transistor 120 through a contact hole that penetrates the passivation layer 150 and the planarization layer 160.

In a top emission structure in which light is emitted in a direction of the second electrode 173 based on the organic light emitting layer 172, the first electrode 171 is formed of a highly reflective metal, such as a stacked structure (Ti/Al/Ti) of aluminum (Al) and titanium (Ti), a stacked structure (ITO/Al/ITO) of aluminum (Al) and indium tin oxide (ITO), an APC alloy, or a stacked structure (ITO/APC/ITO) of APC alloy and ITO. The APC alloy is an alloy of silver (Ag), palladium (Pd) and copper (Cu).

In a bottom emission structure in which light is emitted in a direction of the first electrode 171 based on the organic light emitting layer 172, the first electrode 171 is formed of a transparent conductive material (TCO) such as ITO and IZO, or a semi-transmissive conductive material such as magnesium (Mg), silver (Ag) or an alloy of magnesium (Mg) and silver (Ag). For example, when the first electrode 171 is formed of a semi-transmissive conductive material, light output efficiency is enhanced by a micro cavity.

The pixel defining layer 180 partitions the first electrode 171 on the planarization layer 250 and defines pixels P. The pixel defining layer 180 has an opening that exposes the first electrode 171. The pixel defining layer 180 covers the edge of the first electrode 171. The pixel defining layer 180 is an organic layer formed from, for example, an acryl resin, an epoxy resin, a phenolic resin, a polyimide resin or a polyimide resin.

Each of the pixels P indicates an area in which the first electrode 171, the organic light emitting layer 172 and the second electrode 173 are sequentially stacked such that holes from the first electrode 171 and electrons from the second electrode 173 combine with each other in the organic light emitting layer 172 to emit light.

The organic light emitting layer 172 is formed on the first electrode 171 and side portions of the opening in the pixel defining layer 180. The organic light emitting layer 172 includes an organic material that emits a predetermined color. For example, the organic light emitting layer 172 includes a hole transporting layer, an organic material layer and an electron transporting layer. For example, the organic light emitting layer 172 of a red pixel emits red light, the organic light emitting layer 172 of a green pixel emits green light, and the organic light emitting layer 172 of a blue pixel emits blue light. Alternatively, the organic light emitting layers 172 of the pixels P emit white light. For example, the red pixel further includes a red color filter layer, the green pixel further includes a green color filter layer, and the blue pixel further includes a blue color filter layer.

The second electrode 173 is formed on the organic light emitting layer 172 and the pixel defining layer 180. The second electrode 173 covers the organic light emitting layer 172. The second electrode 173 is a common layer formed over all of the pixels P. A capping layer may be formed on the second electrode 173.

In a top emission structure, the second electrode 173 is formed of a transparent conductive material (TCO) such as ITO and IZO that transmits light, or a semi-transmissive conductive material such as magnesium (Mg) or silver (Ag), or an alloy of magnesium (Mg) and silver (Ag). When the second electrode 173 is formed of a semi-transmissive metal, light output efficiency is enhanced by a micro cavity.

In a bottom emission structure, the second electrode 173 is formed of a highly reflective metal, such as a stacked structure (Ti/Al/Ti) of aluminum (Al) and titanium (Ti), a stacked structure (ITO/Al/ITO) of aluminum (Al) and ITO, an APC alloy, or a stacked structure (ITO/APC/ITO) of APC alloy and ITO. The APC alloy is an alloy of silver (Ag), palladium (Pd) and copper (Cu).

The second substrate SUB2 is disposed on the light emitting element layer EML, and the touch sensor layer TSL is formed on the second substrate SUB2. The touch sensor layer TSL includes first touch electrodes TE, second touch electrodes RE, connection electrodes CE, touch island electrodes TEI, first touch signal lines TL1 to TLp and second touch signal lines RL1 to RLq. In FIGS. 6 and 7, for convenience of illustration, only the second touch electrode RE of the touch sensor layer TSL, touch island electrodes TEI disposed between adjacent first touch electrodes TE, and the connection electrodes CE are illustrated.

The connection electrodes CE are formed on the second substrate SUB2. For example, the connection electrodes CE are disposed on the display area DA (or touch sensor area TSA) of the second substrate SUB2. Each connection electrode CE connects the first touch electrode TE with the touch island electrode TEI. One end of each of the connection electrodes CE is connected to the first touch electrode TE, and the other end thereof is connected to the touch island electrode TEI.

The connection electrodes CE are formed of an opaque metal conductive layer. For example, the connection electrodes CE may be a single layer or include multiple layers formed of one of molybdenum (Mo), aluminum (Al), chromium (Cr), gold (Au), titanium (Ti), nickel (Ni), neodymium (Nd) or copper (Cu), or their alloy. Therefore, to prevent lowering of an aperture ratio of the pixel P, the connection electrodes CE do not overlap the pixels P, as shown in FIG. 7, and overlap the pixel defining layer 180.

A first insulating layer 510 is formed on the second substrate SUB2 and the connection electrodes CE. The first insulating layer 510 is an inorganic layer, formed of, for example, one of a silicon nitride layer, a silicon oxynitride layer, a silicon oxide layer, a titanium oxide layer or an aluminum oxide layer.

The first touch electrodes TE, the touch island electrodes TEI and the second touch electrodes RE are formed on the first insulating layer 510. For example, the first touch electrodes TE, the touch island electrodes TEIs and the second touch electrodes RE correspond to the display area DA (or the touch sensor area TSA) of the substrate SUB2. The first touch electrode TE is connected to the connection electrode CE through a first contact hole CNT1 that penetrates through the first insulating layer 510 and exposes the connection electrode CE. The touch island electrode TEI is connected to the connection electrode CE through a second contact hole CNT2 that penetrates through the first insulating layer 510 and exposes the connection electrode CE. For this reason, the first touch electrode TE and the touch island electrode TEI are connected to each other through the connection electrode CE. Therefore, the first touch electrodes TE that extend in the second direction (Y-axis direction) in each of the plurality of columns are electrically connected to each other.

The first touch electrodes TE, the touch island electrodes TEI and the second touch electrodes RE are formed of a transparent metal oxide (TCO) such as ITO or IZO, which transmit light. Therefore, even when the first touch electrodes TE, the touch island electrodes TEIs and the second touch electrodes RE overlap the pixels P, an aperture ratio of the pixel P is not affected.

A second insulating layer 520 is formed on the first touch electrodes TE, the touch island electrodes TEI, the second touch electrodes RE, and the first insulating layer 510. The second insulating layer 520 is an inorganic layer, formed of, for example, one of a silicon nitride layer, a silicon oxynitride layer, a silicon oxide layer, a titanium oxide layer or an aluminum oxide layer.

As one example shown in FIG. 7, the (1-1)th touch signal line TL1 include a first conductive layer 701 (or first metal layer) and a second conductive layer 702 (or second metal layer that) that are stacked in a vertical direction (e.g., Z-axis direction) and then connected to each other.

The first conductive layer 701 is disposed on the second substrate SUB2. For example, the first conductive layer 701 corresponds to the touch sensor area TSA.

The first conductive layer 701 is in contact with the second substrate SUB2.

The first conductive layer 701 is formed of the same material as the connection electrode CE. In addition, the first conductive layer 701 is formed of the same material as each of a first end connection electrode and a second end connection electrode, which will be described below.

The first conductive layer 701 is disposed on the same layer as the connection electrode CE. In addition, the first conductive layer 701 is disposed on the same layer as the first end connection electrode and the second end connection electrode, which will be described below.

The first conductive layer 701 is formed of a material based on at least one of Mo, Ti or Ta. For example, the first conductive layer 701 includes at least one of Mo, MoNb, Ti or Ta.

The second conductive layer 702 is disposed on the first conductive layer 701. For example, the second conductive layer 702 is disposed on the first insulating layer 510 and overlaps the first conductive layer 701. The second conductive layer 702 is connected to the first conductive layer 701 through a contact hole in the first insulating layer 510. For example, the second conductive layer 702 is in contact with the first conductive layer 701 through a third contact hole CNT3 in the first insulating layer 510.

The second conductive layer 702 may be formed of a low-resistance material, for example, an Al-based material. For example, the second conductive layer 702 includes at least one of Al or AlNb.

For example, the first conductive layer 701 is made of MoNb, and the second conductive layer 702 is made of AlNb. For example, since the first conductive layer 701 made of MoNb is formed first in a manufacturing process, and then the second conductive layer 702 made of AlNb is formed on the first conductive layer 701, an oxide layer of AlNb is prevented from forming at the interface between the first conductive layer 701 and the second conductive layer 702. For example, if the second conductive layer 702 made of AlNb is formed first, the AlNb oxidizes during a subsequent process, such as a patterning process of the second conductive layer 702, a process of forming the first insulating layer 510 and process of forming a contact hole of the first insulating layer 510, so that the oxide layer forms on the second conductive layer 702. For example, a contact defect occurs between the second conductive layer 702 and the first conductive layer 701, e.g., when the first conductive layer 701 is made of MoNb, due to the oxide layer of the second conductive layer 702. Then, signal transmission capability of the (1-1)th touch signal line TL1 is affected due to the contact defect between the first conductive layer 701 and the second conductive layer 702. However, according to an embodiment of the present disclosure, since the second conductive layer 702 made of AlNb is manufactured after the first conductive layer 701 made of MoNb, the first conductive layer 701 and the second conductive layer 702 are in contact with each other before the oxide layer can form on the first conductive layer 701. Therefore, the contact defect between the first conductive layer 701 and the second conductive layer 702 is minimized, so that signal transmission capability of the (1-1)th touch signal line TL1 is increased.

In addition, according to an embodiment of the present disclosure, since no separate process, such as a dry etching process, is needed to remove the oxide layer, manufacturing costs may be reduced.

Further, according to an embodiment of the present disclosure, the (1-1)th touch signal lines TL1 include a plurality of conductive layers, such as a first conductive layer 701 made of MoNb and a second conductive layer 702 made of AlNb, and are connected to each other through the third contact hole CNT3 in the first insulating layer 510 disposed between the plurality of conductive layers, and thus have low resistance. For example, since the plurality of conductive layers 701 and 702 are vertically connected to each other through the third contact hole CNT3, an area of the second conductive layer 702 is increased by an inner area of the third contact hole CNT3, so that an entire area of the (1-1)th touch signal lines TL1 that include the second conductive layer 702 is also increased. Therefore, the resistance of the (1-1)th touch signal lines TL1 that include the first conductive layer 701 and the second conductive layer 702 is reduced, which increases a signal transmission capability of the (1-1)th touch signal line TL1. Furthermore, since the plurality of conductive layers 701 and 702 are vertically stacked through the contact hole CNT3, space utilization in a horizontal direction is increased so that a larger number of (1-1)th touch signal lines TL1 can be disposed in a narrow space.

However, an oxide layer can form on a portion of the second conductive layer 702 other then the interface between the first conductive layer 701 and the second conductive layer 702. For example, the oxide layer forms on sides and an upper surface of the second conductive layer 702.

At least one of the second touch signal lines RL1 to RLq includes a first conductive layer 701 and a second conductive layer 702 in the same manner as the (1-1)th touch signal line TL1 of FIG. 7 described above.

Figure 8:
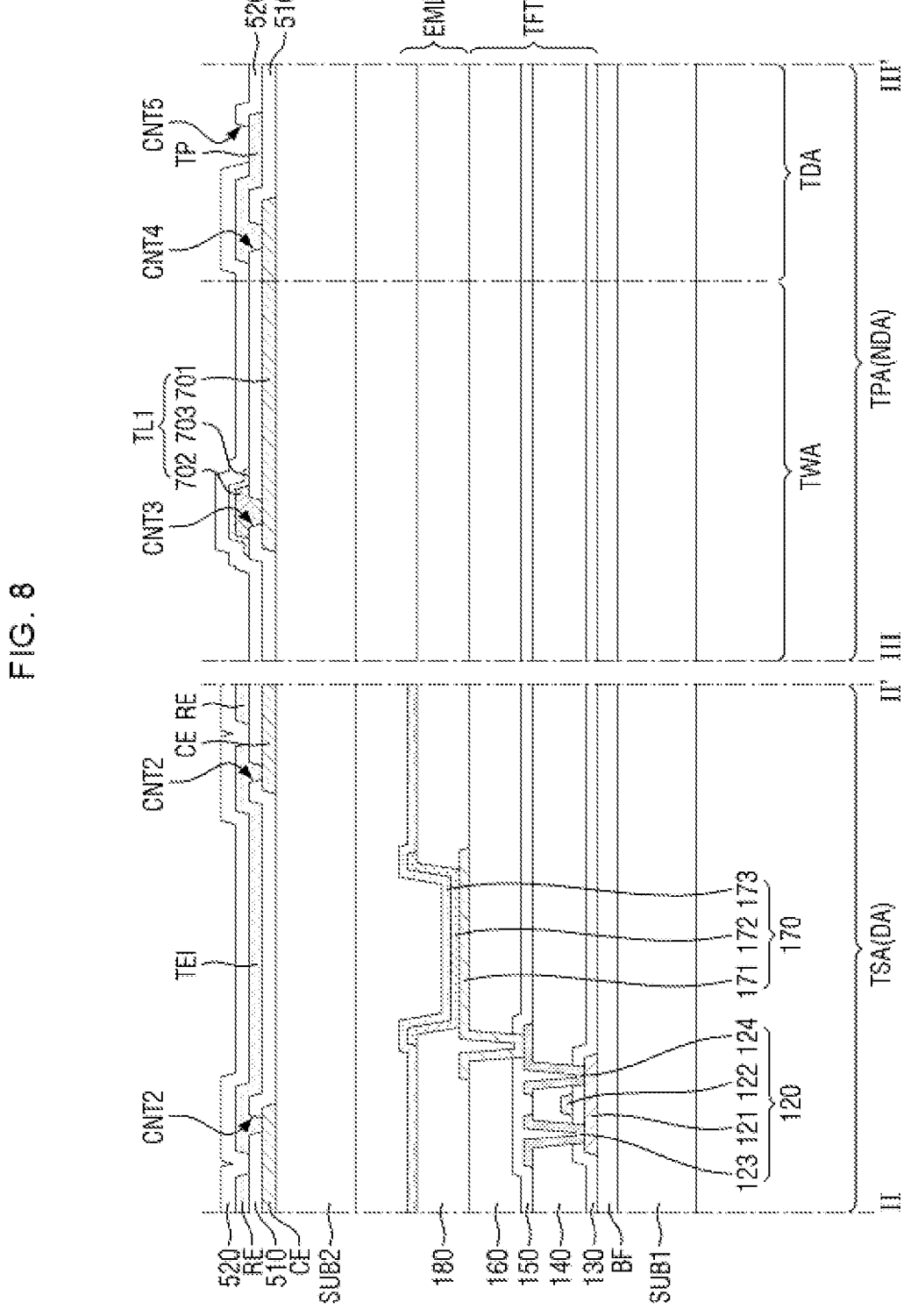
FIG. 8 is a cross-sectional view taken along lines II-II' of FIG. 6 and III-III' of FIG. 5.

FIG. 8 is another cross-sectional view taken along lines II-II' of FIG. 6 and III-III' of FIG. 5.

An embodiment of FIG. 8 differs from an embodiment of FIG. 7 in that the (1-1)th touch signal line TL1 further includes a third conductive layer 703 (or third metal layer). Therefore, a redundant description of an embodiment shown in FIG. 7 will be omitted for FIG. 8.

Referring to FIG. 8, in an embodiment, the (1-1)th touch signal line TL1 further includes a third conductive layer 703 in addition to the first conductive layer 701 and the second conductive layer 702, and the third conductive layer 703 is disposed on the second conductive layer 702.

As shown in FIG. 8, the third conductive layer 703 is directly in contact with the second conductive layer 702. For example, the third conductive layer 703 and the second conductive layer 702 are directly in contact with each other without a contact hole.

The third conductive layer 703 surrounds the second conductive layer 702 exposed by the contact hole.

The third conductive layer 703 is a transparent conductive layer. For example, the third conductive layer 703 is formed of a transparent metal oxide (TCO) such as TIO or IZO that transmit light.

The third conductive layer 703 is made of the same material as the touch electrodes TE and RE.

The third conductive layer 703 is disposed on the same layer as the touch electrodes TE and RE.

However, an oxide layer can form on the interface between the second conductive layer 702 and the third conductive layer 703. For example, the oxide layer does not form on the interface between the first conductive layer 701 and the second conductive layer 702, but the oxide layer can form on the interface between the second conductive layer 702 and the third conductive layer 703.

At least one of the second touch signal lines RL1 to RLq includes a first conductive layer 701, a second conductive layer 702 and a third conductive layer 703 in the same manner as the (1-1)th touch signal line TL1 of FIG. 8 described above.

Figure 9:
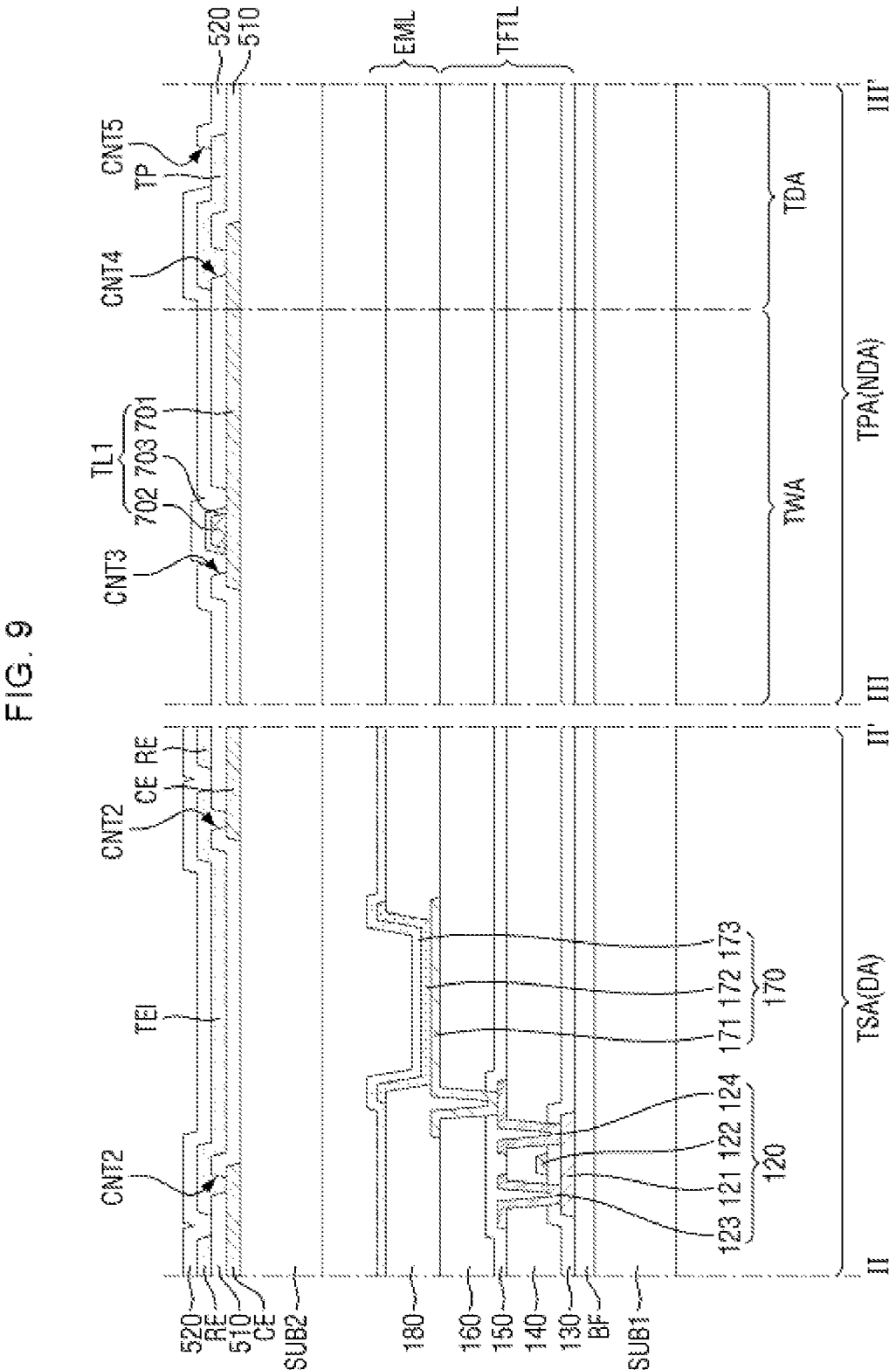
FIG. 9 is a cross-sectional view taken along lines III-III' of FIG. 6 and III-III' of FIG. 5.

FIG. 9 is another cross-sectional view taken along lines II-II' of FIG. 6 and III-III' of FIG. 5.

An embodiment of FIG. 9 differs from an embodiment of FIG. 8 in that the third conductive layer 703 is in contact with the first conductive layer 701. Therefore, a redundant description of an embodiment shown in FIG. 8 will be omitted for FIG. 9.

Referring to FIG. 9, in an embodiment, the third conductive layer 703 is directly in contact with an upper surface and sides of the second conductive layer 702 and is also directly in contact with the first conductive layer 701. Therefore, the second conductive layer 702 is surrounded by the first conductive layer 701 and the third conductive layer 703.

In addition, no oxide layer forms on the interface between the first conductive layer 701 and the second conductive layer 702, but the oxide layer can form on the interface between the second conductive layer 702 and the third conductive layer 703.

At least one of the second touch signal lines RL1 to RLq includes a first conductive layer 701, a second conductive layer 702 and a third conductive layer 703 in the same manner as the (1-1)th touch signal line TL1 of FIG. 8 described above.

Figure 10:
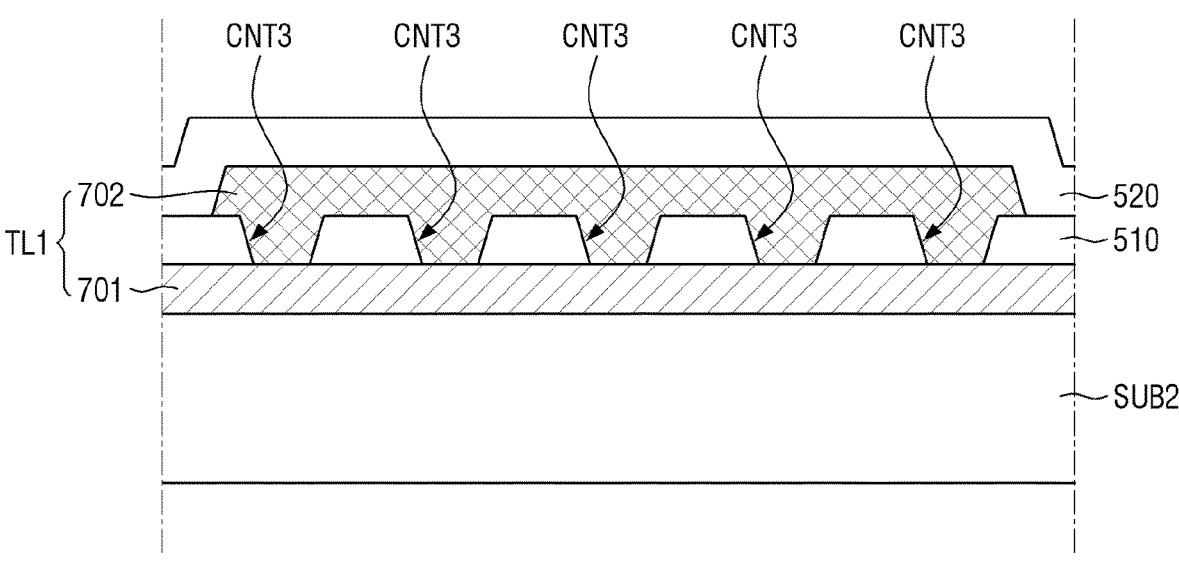
FIG. 10 is a cross-sectional view of a contact structure between a first conductive layer and a second conductive layer according to an embodiment of the present disclosure.

FIG. 10 is a cross-sectional view of a contact structure between a first conductive layer 701 and a second conductive layer 702 according to an embodiment of the present disclosure.

In an example shown in FIG. 10, according to an embodiment, the first insulating layer 510 includes a plurality of third contact holes CNT3.

The first conductive layer 701 of the (1-1)th touch signal line TL1 is in contact with the second conductive layer 702 through the plurality of third contact holes CNT3 in the first insulating layer 510. Therefore, a contact area between the first conductive layer 701 and the second conductive layer 702 is further increased, and resistance of the (1-1)th touch signal line TL1 is further reduced.

In addition, at least one of the second touch signal lines RL1 to RLq has the same structure as the (1-1)th touch signal line TL1 of FIG. 10 described above.

Figure 11:
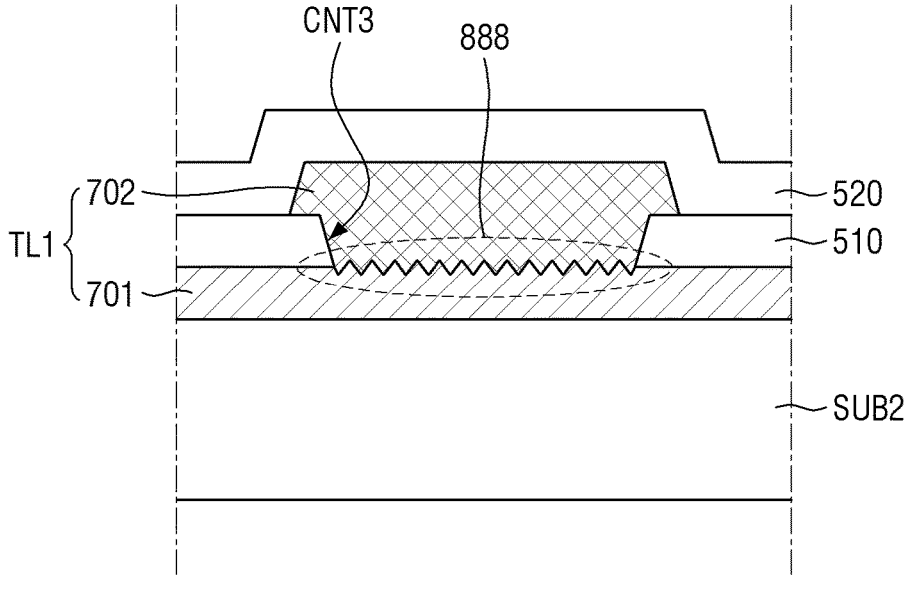
FIG. 11 is a cross-sectional view of a contact structure between a first conductive layer and a second conductive layer according to an embodiment of the present disclosure.

FIG. 11 is a cross-sectional view of a contact structure between a first conductive layer 701 and a second conductive layer 702 according to an embodiment of the present disclosure.

In an example shown in FIG. 11, according to an embodiment, the interface between the first conductive layer 701 and the second conductive layer 702 of the (1-1)th touch signal line TL1 has a triangular-wave-shaped uneven portion 888. For example, a surface of the first conductive layer 701 that is in contact with the second conductive layer 702 includes a plurality of triangular concave portions and a plurality of triangular convex portions, and a surface of the second conductive layer 702 that is in contact with the first conductive layer 701 includes a plurality of triangular concave portions and a plurality of triangular convex portions. The concave portions of the first conductive layer 701 are in contact with the convex portions of the second conductive layer 702, and the convex portions of the first conductive layer 701 are in contact with the concave portions of the second conductive layer 702. Therefore, a contact area between the first conductive layer 701 and the second conductive layer 702 is further increased, and resistance of the (1-1)th touch signal line TL1 is further reduced.

In addition, at least one of the second touch signal lines RL1 to RLq has the same structure as the (1-1)th touch signal line TL1 of FIG. 11 described above.

Figure 12:
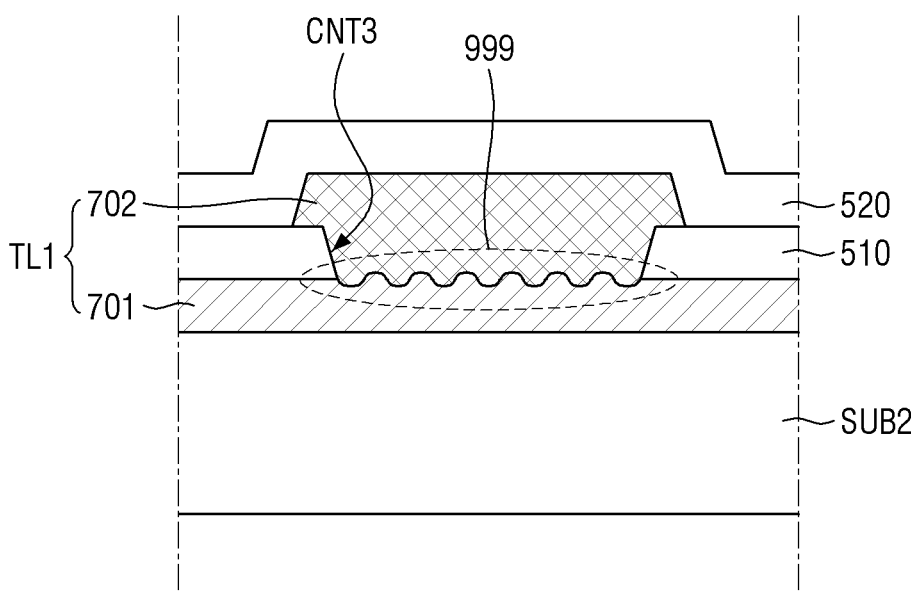
FIG. 12 is a cross-sectional view of a contact structure between a first conductive layer and a second conductive layer according to an embodiment of the present disclosure.

FIG. 12 is a cross-sectional view of a contact structure between a first conductive layer 701 and a second conductive layer 702 according to an embodiment of the present disclosure.

In an example shown in FIG. 12, according to an embodiment, the interface between the first conductive layer 701 and the second conductive layer 702 of the (1-1)th touch signal line TL1 has a rounded-wave shaped uneven portion 999. For example, a surface of the first conductive layer 701 that is in contact with the second conductive layer 702 includes a plurality of round concave portions and a plurality of round convex portions, and a surface of the second conductive layer 702 that is in contact with the first conductive layer 701 includes a plurality of round concave portions and a plurality of round convex portions. The concave portions of the first conductive layer 701 are in contact with the convex portions of the second conductive layer 702, and the convex portions of the first conductive layer 701 are in contact with the concave portions of the second conductive layer 702. Therefore, a contact area between the first conductive layer 701 and the second conductive layer 702 is further increased, and resistance of the (1-1)th touch signal line TL1 is further reduced.

In addition, at least one of the second touch signal lines RL1 to RLq has the same structure as the (1-1)th touch signal line TL1 of FIG. 12 described above.

In addition, the interfaces between the first conductive layer 701 and the second conductive layer 702 in FIGS. 8, 9 and 10 may have a triangular-wave shaped uneven portion 888 shown in FIG. 11 or a rounded-wave shaped uneven portion 999 as shown in FIG. 12.

Furthermore, in FIGS. 8 and 9, the interface between the second conductive layer 702 and the third conductive layer 703 may have a triangular-wave shaped uneven portion 888 as shown in FIG. 11 or a rounded-wave shaped uneven portion 888 as shown in FIG. 12.

Figure 13:
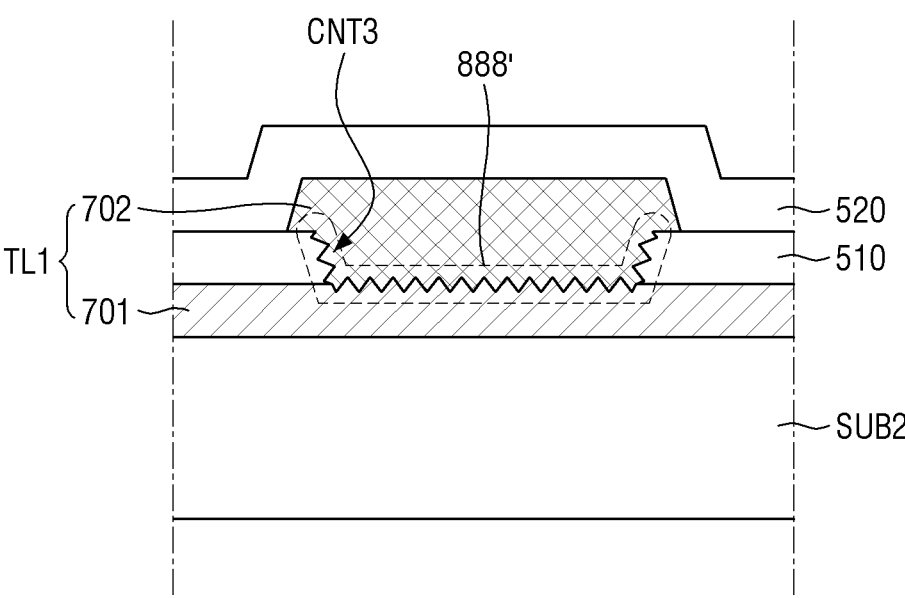
FIG. 13 is a cross-sectional view of a contact structure between a first conductive layer and a second conductive layer according to an embodiment of the present disclosure.

FIG. 13 is a cross-sectional view of a contact structure between a first conductive layer 701 and a second conductive layer 702 according to an embodiment of the present disclosure.

An embodiment shown in FIG. 13 differs from an embodiment shown in FIG. 11 in that an interface between the second conductive layer 702 and an inner wall of the third contact hole CNT3 in the first insulating layer 510 further includes a triangular-wave shaped uneven portion 888'. Therefore, a redundant description of an embodiment shown in FIG. 11 will be omitted for FIG. 13.

Referring to FIG. 13, in an embodiment, a triangular-wave shaped uneven portion 888' is further formed on the interface between the inner wall of the third contact hole CNT3 and the second conductive layer 702 disposed in the third contact hole CNT3. Therefore, a surface area of the second conductive layer 702 is increased so that resistance of the touch signal line is further lowered. Moreover, a coupling force between the second conductive layer 702 and the first conductive layer 701 is improved.

Figure 14:
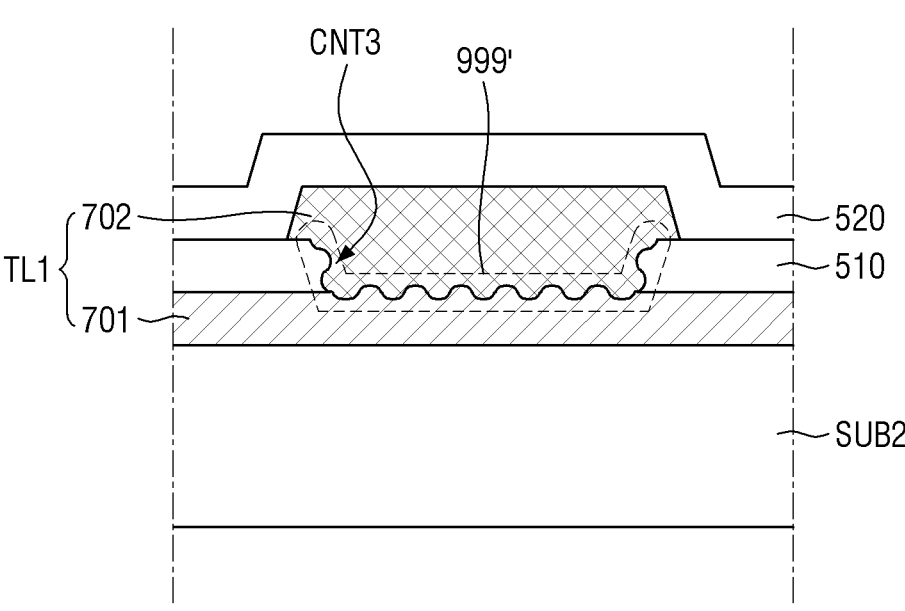
FIG. 14 is a cross-sectional view of a contact structure between a first conductive layer and a second conductive layer according to an embodiment of the present disclosure.

FIG. 14 is a cross-sectional view of a contact structure between a first conductive layer 701 and a second conductive layer 702 according to an embodiment of the present disclosure.

An embodiment shown in FIG. 14 differs from an embodiment shown in FIG. 12 in that the interface between the second conductive layer 702 and the inner wall of the third contact hole CNT3 in the first insulating layer 510 further includes a rounded-wave shaped uneven portion 999'. Therefore, a redundant description of an embodiment shown in FIG. 12 will be omitted for FIG. 14.

Referring to FIG. 14, in an embodiment, the rounded-wave shaped uneven portion 999' is further formed on the interface between the inner wall of the third contact hole CNT3 and the second conductive layer 702 disposed in the third contact hole CNT3. Therefore, a surface area of the second conductive layer 702 is increased and resistance of the touch signal line is further reduced. Moreover, a coupling force between the second conductive layer 702 and the first conductive layer 701 is increased.

FIGS. 15 to 19 illustrate a manufacturing method of a display device that includes a touch sensing unit, according to an embodiment of the present disclosure.

Figure 15:
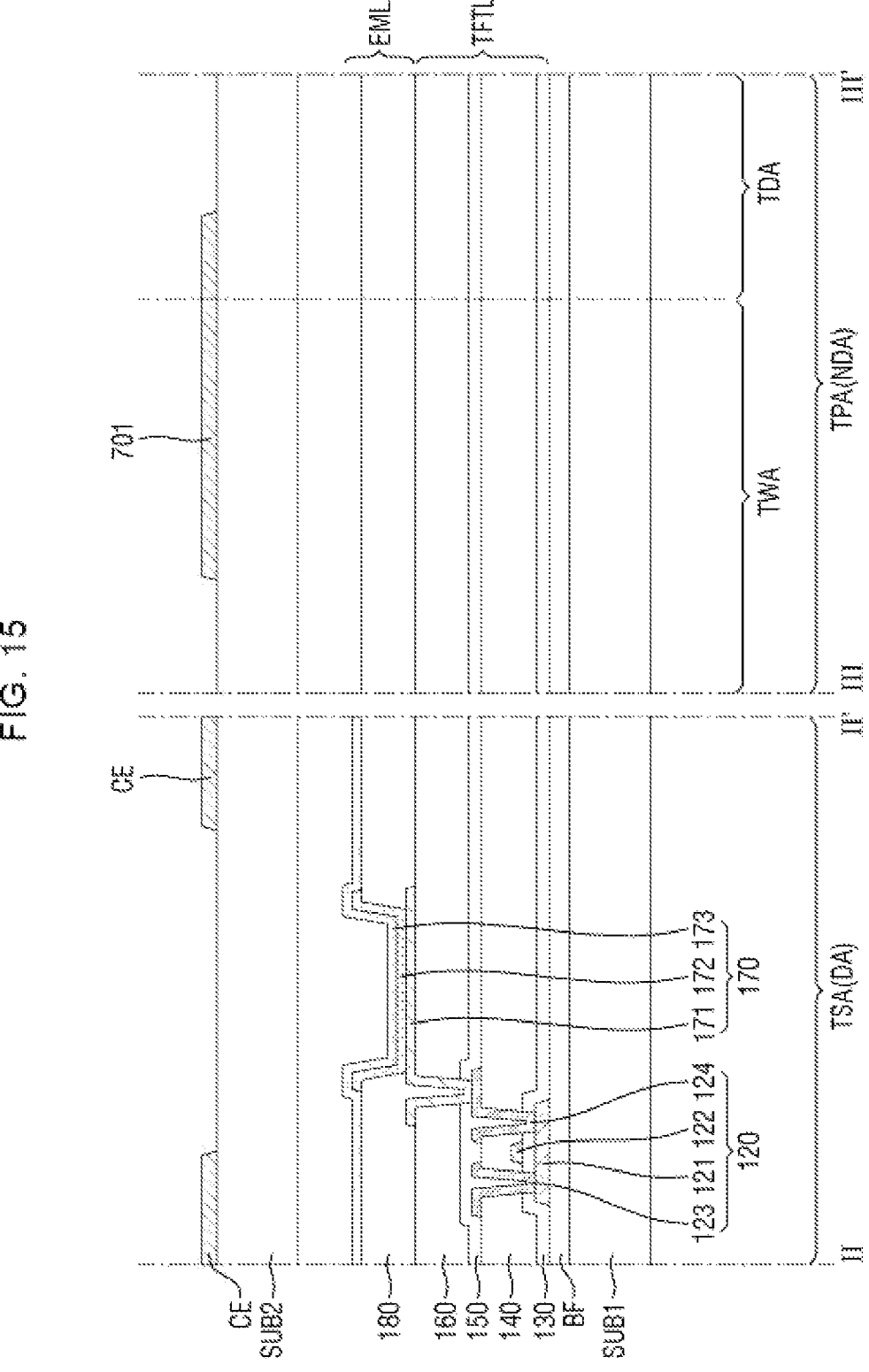

As shown in FIG. 15, in an embodiment, a display panel 100 that includes a first substrate SUB1, a buffer film BF, an active layer 121, a gate electrode 122, a source electrode 123, a drain electrode 124, a gate insulating layer 130, an interlayer insulating layer 140, a passivation layer 150, a planarization layer 160, a first electrode 171, an organic light emitting layer 172, a second electrode 173 and a pixel defining layer 180, is prepared, and a second substrate SUB2 is formed on the second electrode 173 of the display panel 100. A first layer that includes a first material, such as MoNb, is formed on the second substrate SUB2. The first layer is patterned through a first photolithography process that uses a first mask, so that the connection electrode CE and the first conductive layer 701 of the (1-1)th touch signal line TL1 are formed on the second substrate SUB2. In addition, a first conductive layer, a first end connection electrode and a second end connection electrode of the (2-1)th touch signal line RL1 are formed on the second substrate SUB2 during the first photolithography process. The first end connection electrode is connected to an outermost first touch electrode of the plurality of first touch electrodes TE disposed along one column, and corresponds to a portion of the first conductive layer 701 provided in the (1-1)th touch signal line TL1. The second end connection electrode is connected to an outermost second touch electrode of the plurality of second touch electrodes disposed along one row, and corresponds to a portion of the second conductive layer provided in the (2-1)th touch signal line RL1.

Figure 16:
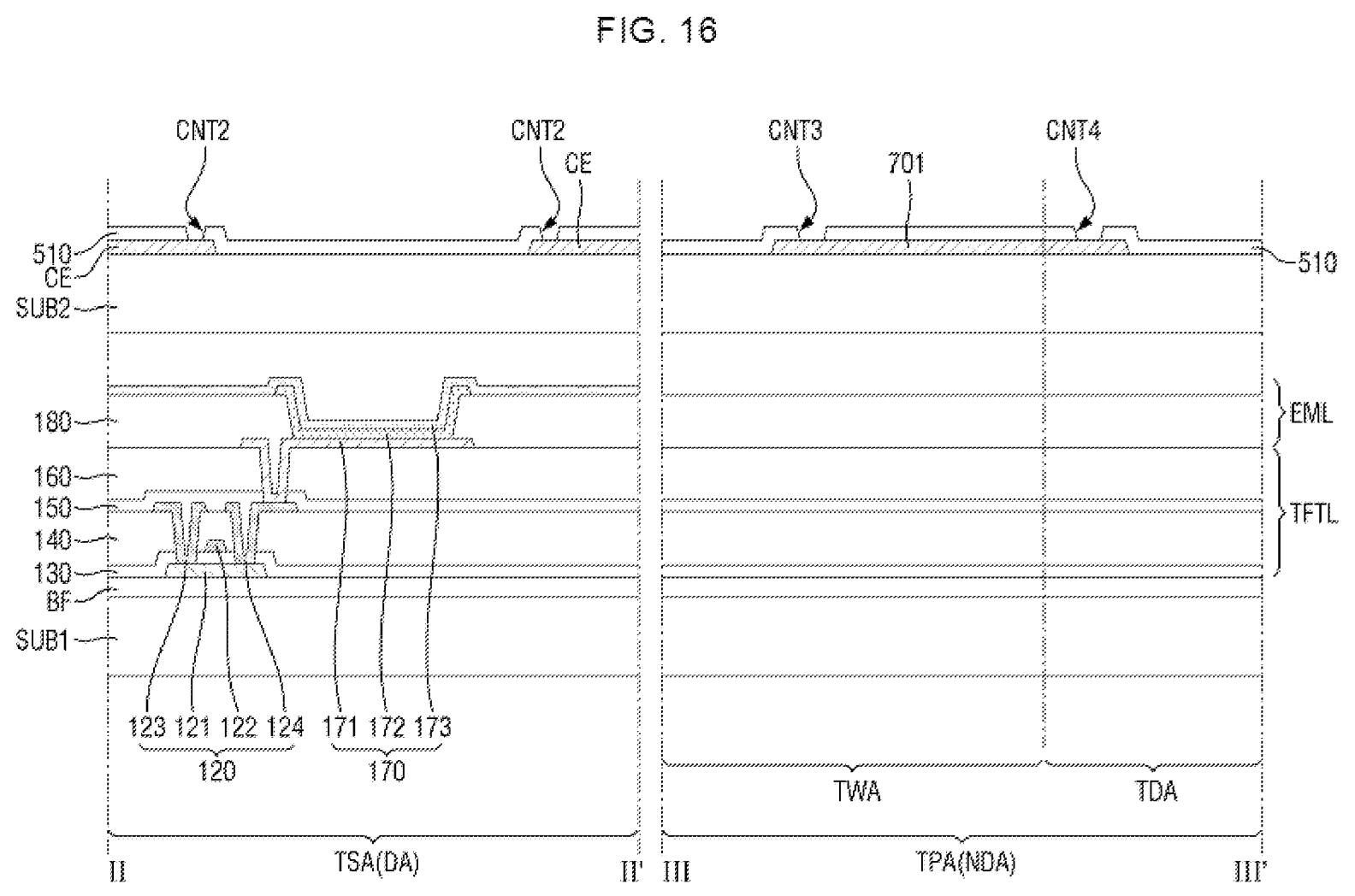

As shown in FIG. 16, in an embodiment, a first insulating layer 510 is formed on the connection electrode CE and the first conductive layer 701. For example, the first insulating layer 510 is formed on an entire surface of the second substrate SUB2 and covers the connection electrode CE and the first conductive layer 701. The first insulating layer 510 includes an inorganic layer, such as one of a silicon nitride layer, a silicon oxynitride layer, a silicon oxide layer, a titanium oxide layer or an aluminum oxide layer. The first insulating layer 510 is patterned through a second photolithography process that uses a second mask, so that a second contact hole CNT2 that exposes a portion of the connection electrode CE, a third contact hole CNT3 that exposes a portion of the first conductive layer 701 of the (1-1)th touch signal line TL1 and a fourth contact hole CNT4 that exposes another portion of the first conductive layer 701 of the (1-1)th touch signal line TL1 are formed in the first insulating layer 510. The third contact hole CNT3 is formed in a touch wiring area TWA of a touch peripheral area TPA, and the fourth contact hole CNT4 is formed in a touch pad area TDA of the touch peripheral area TPA. In addition, a sixth contact hole that exposes a portion of the first conductive layer of the (2-1)th touch signal line RL1 and a seventh contact hole that exposes another portion of the first conductive layer of the (2-1)th touch signal line RL1 are formed in the first insulating layer 510 during the second photolithography process. The sixth contact hole is formed in the touch wiring area TWA of the touch peripheral area TPA, and the seventh contact hole is formed in the touch pad area TDA of the touch peripheral area TPA. In addition, a first end contact hole that exposes a portion of the first end connection electrode and a second end contact hole that exposes a portion of the second end connection electrode are formed in the first insulating layer 510 during the second photolithography process.

Figure 17:
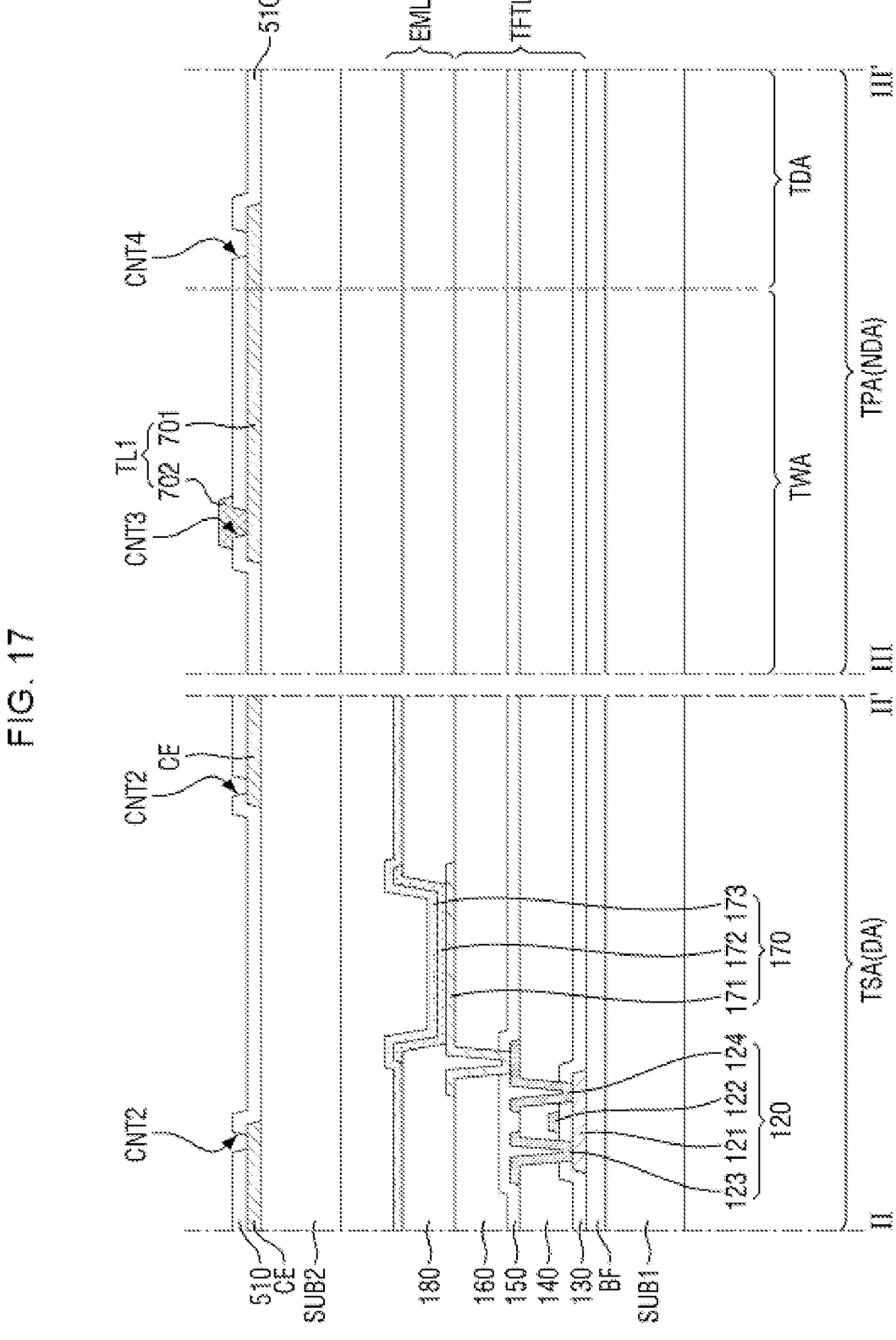

As shown in FIG. 17, in an embodiment, a second layer that includes a second material, such as AlNb, is formed on the first insulating layer 510. The second layer is patterned through a third photolithography process that uses a third mask, so that the second conductive layer 702 overlapped with the third contact hole CNT3 is formed on the first insulating layer 510. The second conductive layer 702 is in contact with the first conductive layer 701 through the third contact hole CNT3 in the first insulating layer 510. Therefore, the (1-1)th touch signal line TL1, which includes first and second conductive layers 701 and 702 connected to each other, is formed. The second conductive layer of the (2-1)th touch signal line RL1 overlapped with the sixth contact hole is formed on the first insulating layer 510 during the third photolithography process. The second conductive layer of the (2-1)th touch signal line RL1 is in contact with the first conductive layer of the (2-1)th touch signal line RL1 through the sixth contact hole in the first insulating layer 510. Therefore, the (2-1)th touch signal line RL1, which includes the first and second conductive layers connected to each other, is formed. Since the second conductive layer 702 made of AlNb is formed after the first conductive layer 701 made of MoNb, the first conductive layer 701 and the second conductive layer 702 are in contact with each other before the oxide layer can form in the first conductive layer 701. Therefore, a contact defect between the first conductive layer 701 and the second conductive layer 702 is minimized, so that signal transmission capability of the (1-1)th touch signal line TL1 and the (2-2)th touch signal line RL1 is increased. In addition, since the plurality of conductive layers 701 and 702 are vertically connected to each other through the third contact hole CNT3 in the first insulating layer 510, an area of the second conductive layer 702 is increased by an inner area of the third contact hole CNT3, so that the entire area of the (1-1)th touch signal line TL1, which includes the second conductive layer 702, is also increased. Therefore, signal transmission capability of the (1-1)th touch signal line TL1 and the (2-2)th touch signal line RL1 is increased. In addition, since the plurality of conductive layers 701 and 702 are vertically stacked through the third contact hole CNT3, space utilization in a horizontal direction is increased so that a larger number of (1-1)th touch signal lines TL1 and (2-1)th touch signal lines RL1 can be disposed in a narrow space.

Figure 18:
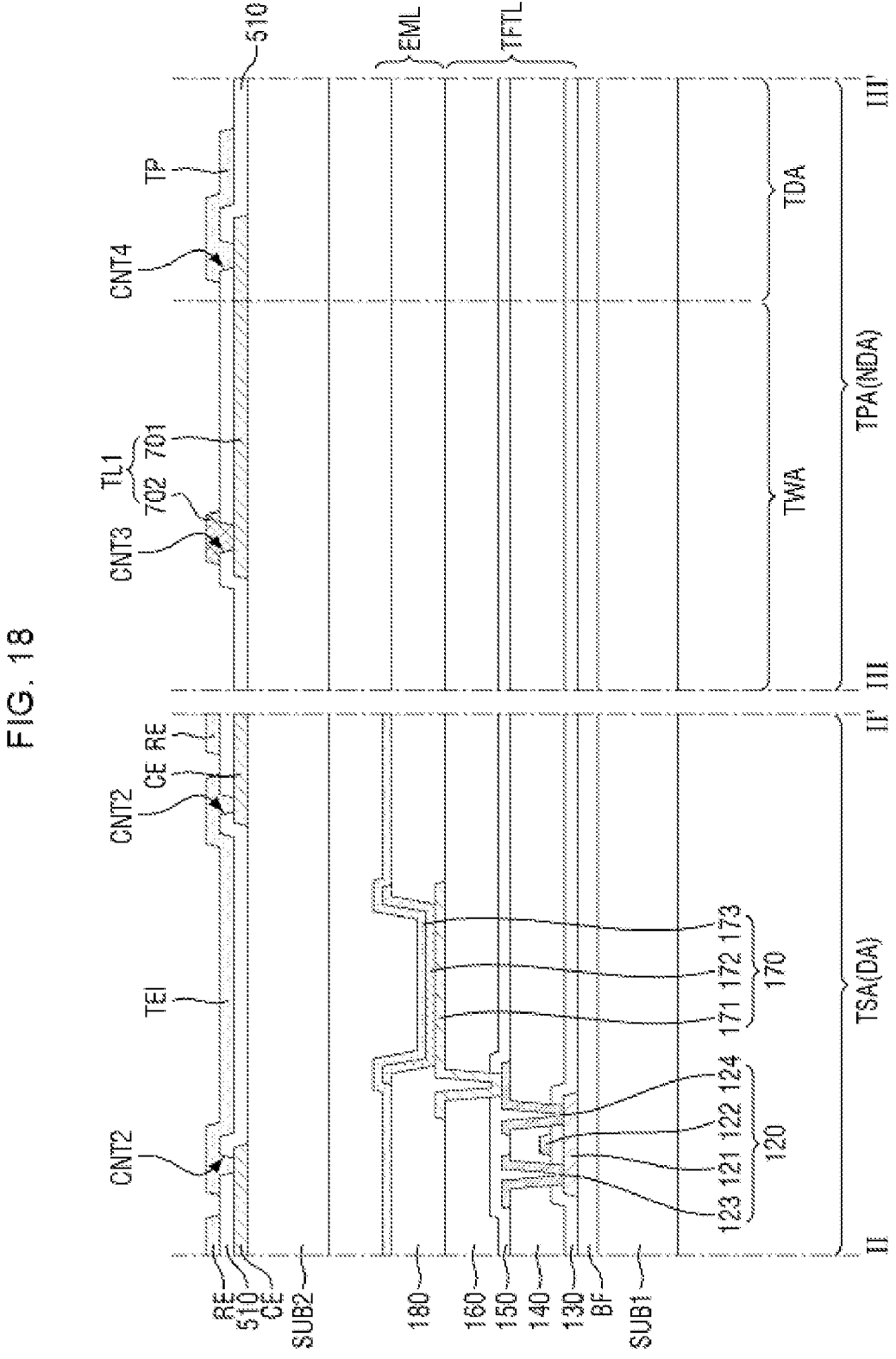

As shown in FIG. 18, in an embodiment, a third layer that includes a third material, such as ITO, is formed on the first insulating layer 510 and the second conductive layer 702. The third layer is patterned through a fourth photolithography process that uses a fourth mask, so that a second touch electrode RE, a touch island electrode TEI and a touch electrode pad TP are formed on the first insulating layer 510. Both ends of the touch island electrode TEI respectively overlap the second contact holes CNT2 on the first insulating layer 510, and one end of the touch electrode pad TP overlaps the fourth contact hole CNT4 on the first insulating layer 510. In addition, a first touch electrode TE is formed on the first insulating layer 510 during the fourth lithography process. The outermost first touch electrode, such as the first touch electrode directly connected to the (1-1)th touch signal line TL1, is in contact with the first end connection electrode through the first end contact hole. The outermost second touch electrode, such as the second touch electrode directly connected to the (2-1)th touch signal line RL1, is in contact with the second end connection electrode through the second end contact hole.

Figure 19:
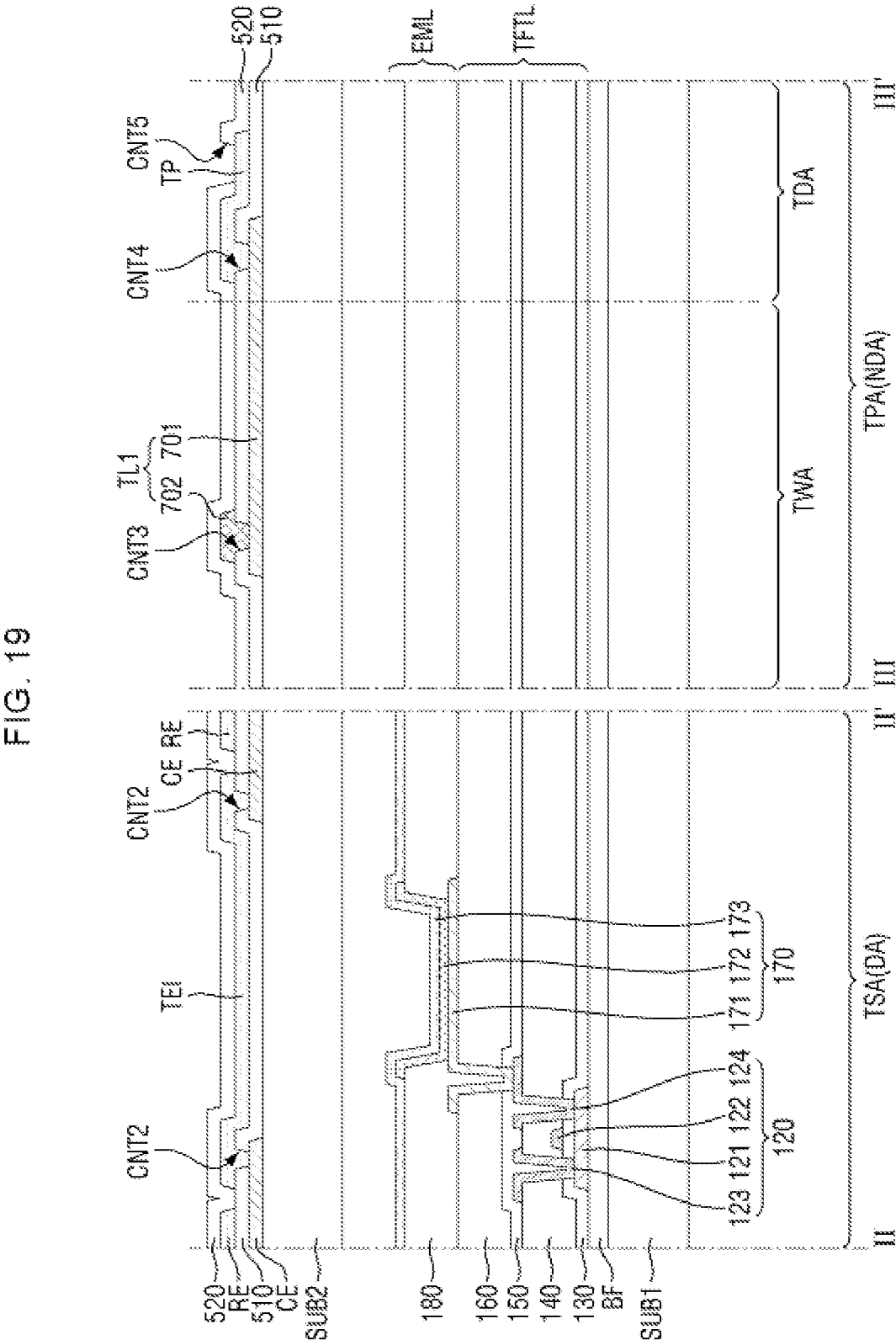

As shown in FIG. 19, in an embodiment, a second insulating layer 520 is formed on the touch island electrode TEI, the first touch electrode TE, the second touch electrode RE, the connection electrode CE, the first end connection electrode, the second end connection electrode, the second conductive layer 702, the touch electrode pad TP and the first insulation layer 510. For example, the second insulating layer 520 is formed on the entire surface of the second substrate SUB2 and covers the touch island electrode TEI, the first touch electrode TE, the second touch electrode RE, the connection electrode CE, the first end connection electrode, the second end connection electrode, the second conductive layer 702, the touch electrode pad TP and the first insulating layer 510. The second insulating layer 520 includes an inorganic layer, such as one of a silicon nitride layer, a silicon oxynitride layer, a silicon oxide layer, a titanium oxide layer or an aluminum oxide layer. The second insulating layer 520 is patterned using a fifth photolithography process that uses a fifth mask, so that a fifth contact hole CNT5 that exposes the other end of the touch electrode pad TP connected to the (1-1)th touch signal line TL1 is formed in the second insulating layer 520. In addition, an eighth contact hole that exposes the other end of the touch electrode pad connected to the (2-1)th touch signal line RL1 is formed in the second insulating layer 520 during the fifth photolithography process.

According to a manufacturing method of a display device having a structure shown in FIG. 8, a third conductive layer 703 is further formed on the second conductive layer 702 during a process described with reference to FIG. 18, such as the fourth photolithography process. The third conductive layer 703 is made of the same material as the touch island electrode TEI and the touch electrode pad TP.

A manufacturing method of a display device having a structure shown in FIG. 9 is substantially the same as a manufacturing method of a display device having a structure shown in FIG. 8, and the first insulating layer is patterned so that the third contact hole CNT3 surrounds the second conductive layer 702 and the third conductive layer 703 in a plan view during a process of FIG. 16, such as the second photolithography process.

Figure 20:
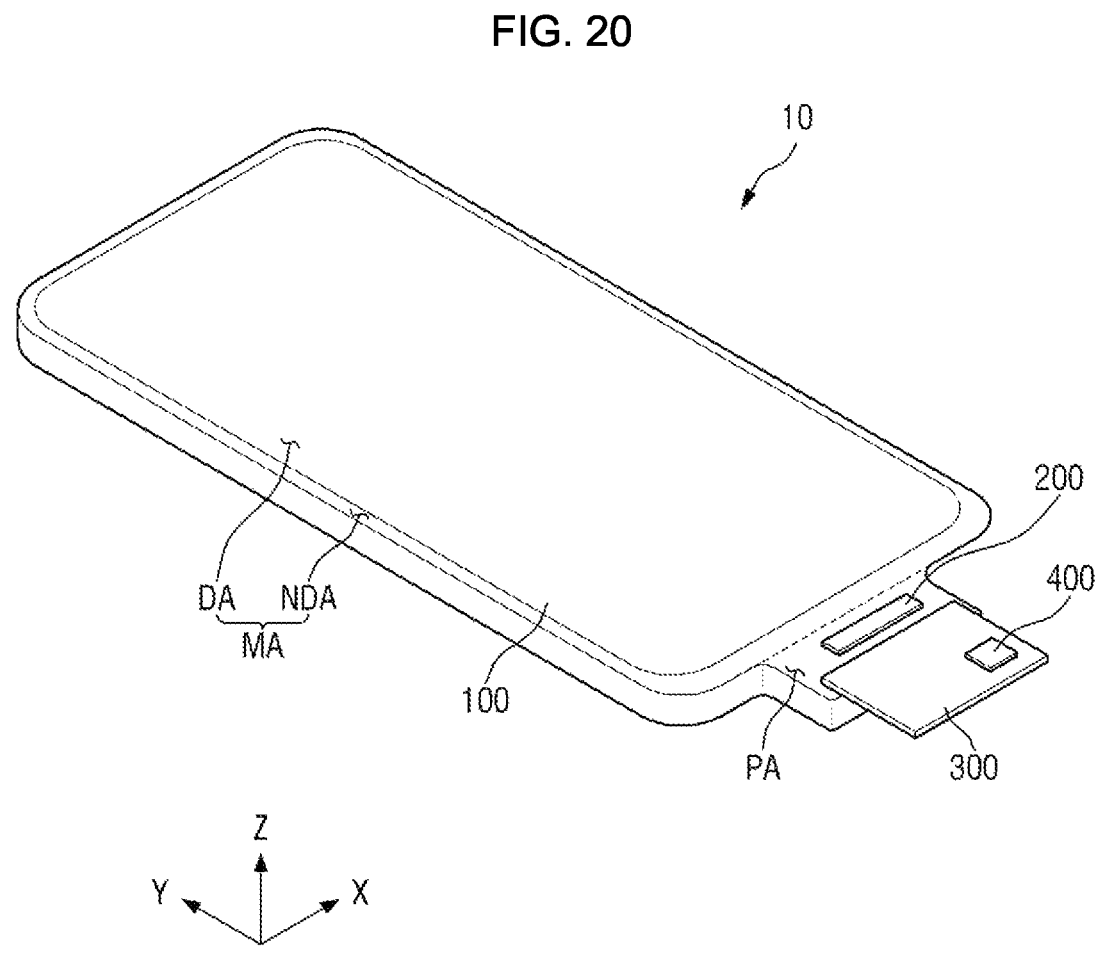

FIG. 20 is a perspective view of a display device according to an embodiment. FIG. 21 is a plan view of a display device according to an embodiment.

An embodiment shown in FIGS. 20 and 21 differs from an embodiment shown in FIGS. 1 and 2 in that the display panel 100 includes a main area MA and a protruded area PA that protrudes from the main area MA. Therefore, a redundant description of an embodiment shown in FIGS. 1 and 2 will be omitted for FIGS. 20 and 21.

Referring to FIGS. 20 and 21, in an embodiment, a display device 10 according to one embodiment includes a display panel 100, a display driving circuit 200, a circuit board 300 and a touch driving circuit 400.

The display panel 100 includes a main area MA and a protruded area PA that protrudes from one side of the main area MA.

The main area MA has a rectangular shape that has short sides in the first direction (X-axis direction) and long sides in the second direction (Y-axis direction) that crosses the first direction (X-axis direction). A corner where the short side in the first direction (X-axis direction) and the long side in the second direction (Y-axis direction) meet may be rounded with a predetermined curvature, or may form a right angle. The planar shape of the display panel 100 is not necessarily limited to a rectangle, and may have other shapes, such as a polygonal shape, a circular shape or an oval shape. In an embodiment, the main area MA is flat, but is not necessarily limited thereto, and in other embodiments, includes a curved portion at the left and right ends. The curved portion may have a predetermined curvature or a changing curvature.

The main area MA includes a display area DA that includes pixels that display an image and a non-display area NDA that is a peripheral area of the display area DA.

In addition to pixels, scan lines, data lines and a power line that are connected to the pixels are disposed in the display area DA. When the main area MA includes a curved portion, the display area DA is disposed in the curved portion. An image of the display panel 100 can be seen even in the curved portion.

The non-display area NDA is an area that extends from the display area DA to the edge of the display panel 100. A scan driver that applies scan signals to scan lines and link lines that connect the data lines with the display driving circuit 200 are disposed in the non-display area NDA.

The protruded area PA protrudes from one side of the main area MA. For example, as shown in FIG. 20, the protruded area PA protrudes from a lower side of the main area MA. A length of the protruded area PA in the first direction (X-axis direction) is shorter than a length of the main area MA in the first direction (X-axis direction).

The protruded area PA includes a bent area BA and a pad area PDA. For example, the pad area PDA is disposed at one side of the bent area BA, and the main area MA is disposed at the other side of the bent area BA. For example, the pad area PDA is disposed at a lower side of the bent area BA, and the main area MA is disposed at an upper side of the bent area BA.

The display panel 100 is flexible so that it can be bent, folded or rolled. For example, the display panel 100 can be bent in a thickness direction (Z-axis direction) in the bent area BA. For example, one surface of the pad area PDA of the display panel 100 is upwardly directed before the display panel 100 is bent, but is downwardly directed after the display panel 100 is bent. For this reason, since the pad area PDA is disposed below the main area MA, the pad area PDA overlaps the main area MA.

Pads that are electrically connected to the display driving circuit 200 and the circuit board 300 are disposed in the pad area PDA of the display panel 100. The pads include display pads that are electrically connected to the display driving circuit 200 and touch pads that are electrically connected to touch lines.

The touch driving circuit 400 is disposed on the circuit board 300. The touch driving circuit 400 is an integrated circuit (IC) and mounted on the circuit board 300.

FIG. 22 is a cross-sectional view taken along line IV-IV' of FIG. 21.

An embodiment shown in FIG. 22 differs from an embodiment shown in FIG. 3 in that the second substrate SUB2 is omitted and the touch sensor layer TSL is disposed on a thin film encapsulation layer TFEL. For FIG. 22, a redundant description of an embodiment shown in FIG. 3 will be omitted.

Referring to FIG. 22, in an embodiment, the thin film encapsulation layer TFEL is disposed in both the display area DA and the non-display area NDA. For example, the thin film encapsulation layer TFEL covers the thin film transistor layer TFTL and the light emitting element layer EML of the display area DA and the non-display area NDA.

The touch sensor layer TSL is disposed on the thin film encapsulation layer TFEL. Since the touch sensor layer TSL is disposed directly on the thin film encapsulation layer TFEL, a thickness of the display device 10 can be reduced as compared with a case in which a separate touch panel that includes the touch sensor layer TSL is attached onto the thin film encapsulation layer TFEL.

Figure 23:
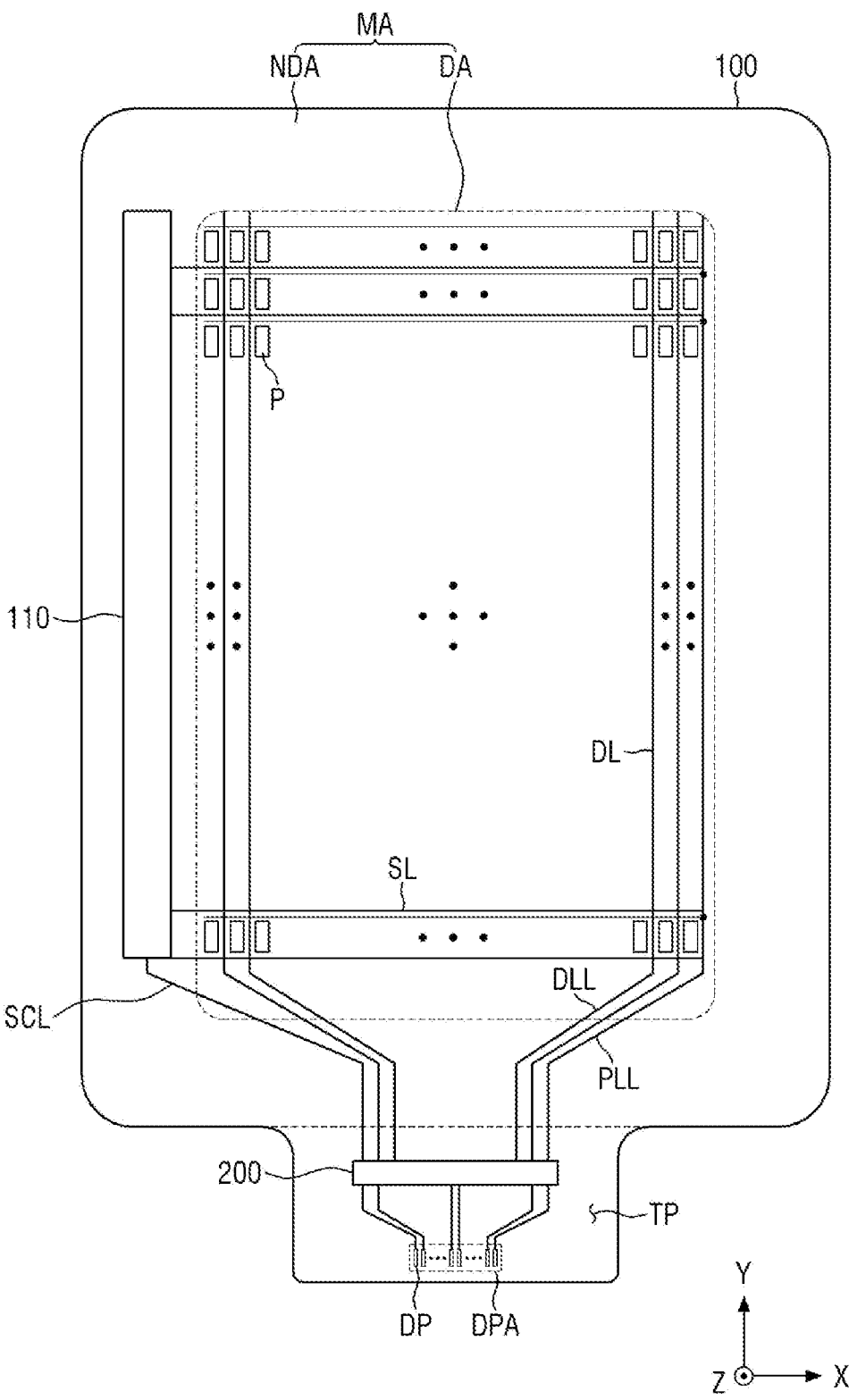
FIG. 23 is a detailed plan view of a display unit of FIG. 22.
Figure 24:
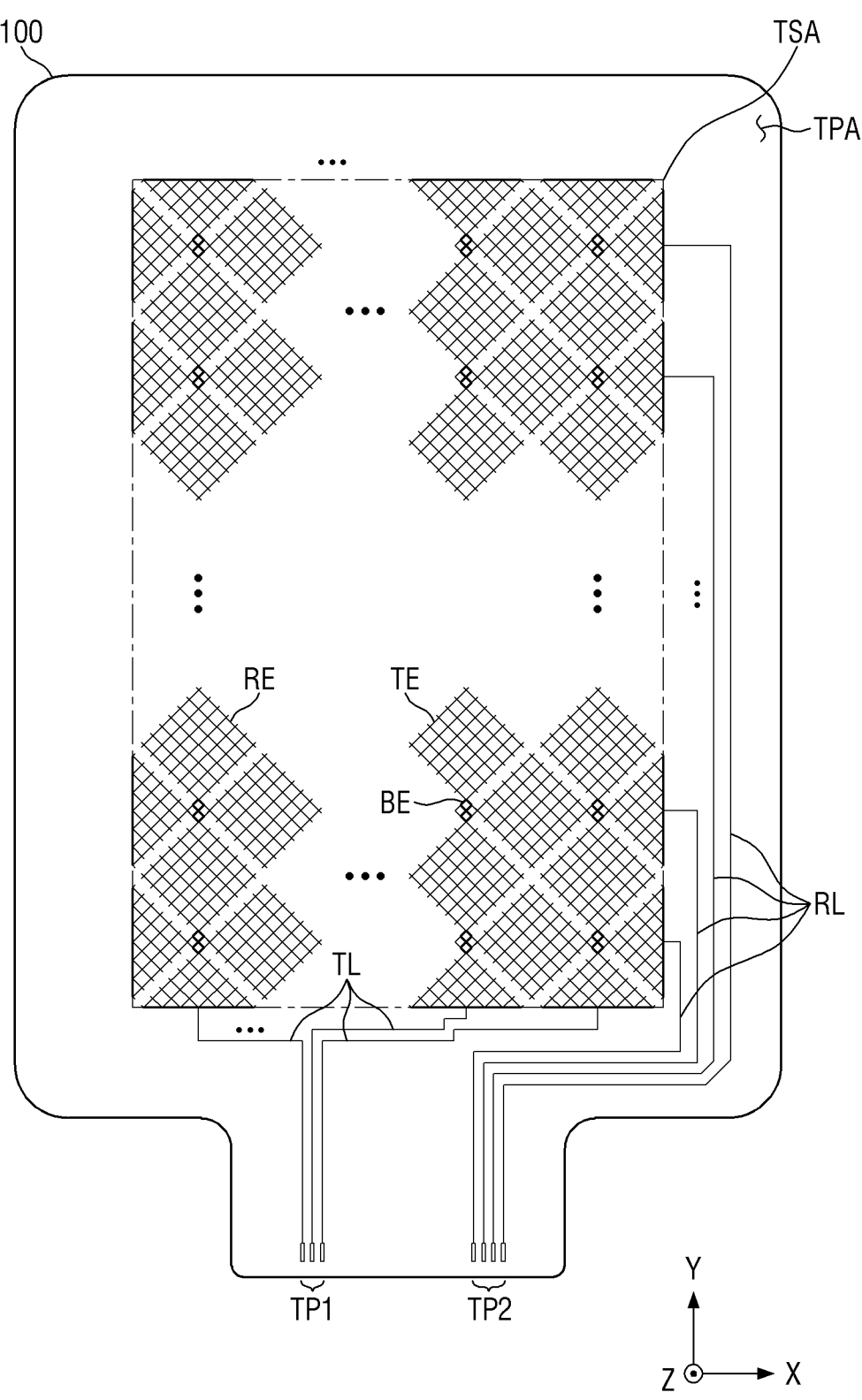
FIG. 24 is a detailed plan view of a touch sensing unit of FIG. 22.

FIG. 23 illustrates a display unit of FIG. 22. FIG. 24 illustrates a touch sensing unit of FIG. 22.

An embodiment shown in FIGS. 23 and 24 differs from an embodiment shown in FIGS. 4 and 5 in that the display electrode pads DP and the touch electrode pads TP1 and TP2 are disposed in the pad area PDA of the protruded area PA of the display panel 100, and the touch electrodes TE and RE form a mesh shape. Therefore, a redundant description of an embodiment shown in FIGS. 4 and 5 will be omitted for FIGS. 23 and 24.

Referring to FIGS. 23 and 24, in an embodiment, the display electrode pads DP are disposed at one end of the protruded area PA of the display panel 100. The first touch electrode pads TP1 are disposed at the left side of the display electrode pads DP, and the second touch electrode pads TP2 are disposed at the right side of the display electrode pads DP.

The first touch electrodes TE, the second touch electrodes RE and the connection electrodes CE form a mesh s as shown in FIG. 24. When the touch sensor layer TSL, which includes the first touch electrodes TE and the second touch electrodes RE, is directly formed on the thin film encapsulation layer TFEL as shown in FIG. 22, a distance between the second electrode of the light emitting element layer EML and the driving electrodes TE or the sensing electrodes RE of the touch sensor layer TSL is short, so that parasitic capacitance can formed between the second electrode of the light emitting element layer EML and the first touch electrode TE or the second touch electrode RE of the touch sensor layer TSL. Therefore, to reduce such parasitic capacitance, the first touch electrodes TE and the second touch electrodes RE are formed as mesh-type structure as shown in FIG. 22 rather than non-patterned electrodes of a a transparent oxide conductive layer such as ITO or IZO.

The first touch electrodes TE and the second touch electrodes RE are formed on the same layer, and the connection electrodes CE are formed on a different layer from the first touch electrodes TE and the second touch electrodes RE. The first touch electrodes TE, the second touch electrodes RE and the connection electrodes CE may be formed of a single layer or from multiple-layers that include one or more of molybdenum (Mo), aluminum (Al), chromium (Cr), gold (Au), titanium (Ti), nickel (Ni), neodymium (Nd) or copper (Cu), or their alloy.

In addition, at least one of the first touch signal lines TL and at least one of the second touch signal lines RL in FIG. 24 has a structure that is substantially the same as at least one of the structures of the (1-1)th touch signal lines TL1 shown in FIGS. 7 to 12 and described above.

In concluding the detailed description, those skilled in the art will appreciate that many variations and modifications can be made to embodiments without substantially departing from the principles of the invention concept. Therefore, disclosed embodiments of the disclosure are used in a generic and descriptive sense only and not for purposes of limitation.

What is claimed is:

1. A touch sensing unit, comprising:

a substrate;

a touch electrode disposed in a touch sensor area of the substrate; and a touch signal line connected to the touch electrode and that extends to a touch peripheral area of the substrate, wherein in at least the touch peripheral area, the touch signal line includes a first conductive layer disposed on the substrate, and a second conductive layer disposed on the first conductive layer with an insulating layer interposed therebetween, wherein the second conductive layer is in contact with the first conductive layer through a contact hole in the insulating layer, wherein the first conductive layer includes at least one of molybdenum niobium (MoNb), or tantalum (Ta), wherein the second conductive layer includes aluminum niobium (AlNb), wherein the touch signal line prevents formation of an oxide layer of aluminum niobium at an interface between the first conductive layer and the second conductive layer where the first conductive layer and the second conductive layer are in contact with each other, and wherein the interface where the first conductive layer and the second conductive layer are in contact with each other has an uneven portion, wherein the interface extends in directions parallel to extension directions of the substrate and the uneven portion extends in a direction perpendicular to the extension directions of the substrate.

2. The touch sensing unit of claim 1, wherein the first conductive layer of the touch signal line is made of a same material as a connection electrode disposed in the touch sensor area.

3. The touch sensing unit of claim 2, wherein the first conductive layer is disposed on a same layer as the connection electrode.

4. The touch sensing unit of claim 1, wherein the second conductive layer is disposed on a same layer as the touch electrode.

5. The touch sensing unit of claim 1, wherein the touch signal line further includes a third conductive layer disposed on the second conductive layer, wherein the third conductive layer is in contact with the second conductive layer.

6. The touch sensing unit of claim 5, wherein the third conductive layer surrounds the second conductive layer exposed by the contact hole.

7. The touch sensing unit of claim 5, wherein the third conductive layer is directly in contact with the second conductive layer.

8. The touch sensing unit of claim 5, wherein the third conductive layer includes a transparent conductive layer.

9. The touch sensing unit of claim 5, wherein the third conductive layer is made of a same material as the touch electrode.

10. The touch sensing unit of claim 9, wherein the third conductive layer is disposed on a same layer as the touch electrode.

11. The touch sensing unit of claim 1, wherein the insulating layer includes a plurality of contact holes.

12. The touch sensing unit of claim 1,
wherein the first conductive layer and the second conductive layer each include a plurality of convex portions and a plurality of concave portions alternately arranged, and
wherein the uneven portion includes the plurality of convex portions of the first conductive layer directly contacting the plurality of concave portions of the second conductive layer and the plurality of convex portions of the second conductive layer directly contacting the plurality of concave portions of the first conductive layer.

13. The touch sensing unit of claim 12, wherein the uneven portion has a triangular-wave shape or a rounded-wave shape.

14. The touch sensing unit of claim 1, wherein an interface where an inner wall of the contact hole and the second conductive layer are in contact with each other has an uneven portion.

15. The touch sensing unit of claim 14, wherein the uneven portion has a triangular-wave shape or a rounded-wave shape.

16. A display device, comprising:
a display panel; and
a touch sensing unit disposed on the display panel,
wherein the touch sensing unit includes:
a substrate;
a touch electrode disposed in a touch sensor area of the substrate; and a touch signal line connected to the touch electrode and that extends to a touch peripheral area of the substrate,
wherein in at least the touch peripheral area, the touch signal line includes a first conductive layer disposed on the substrate, and a second conductive layer disposed on the first conductive layer with an insulating layer interposed therebetween, wherein the second conductive layer is in contact with the first conductive layer through a contact hole in the insulating layer,
wherein the first conductive layer includes at least one of molybdenum niobium (MoNb), or tantalum (Ta),
wherein the second conductive layer includes aluminum niobium (AlNb),
wherein the touch signal line prevents formation of an oxide layer of aluminum niobium at an interface between the first conductive layer and the second conductive layer where the first conductive layer and the second conductive layer are in contact with each other, and
wherein the interface where the first conductive layer and the second conductive layer are in contact with each other has an uneven portion, wherein the interface extends in directions parallel to extension directions of the substrate and the uneven portion extends in a direction perpendicular to the extension directions of the substrate.

17. The display device of claim 16, wherein the first conductive layer of the touch signal line is made of a same material as a connection electrode disposed on the touch sensor area.

18. The display device of claim 17, wherein the first conductive layer is disposed on a same layer as the connection electrode.

19. The display device of claim 16, wherein the second conductive layer is disposed on a same layer as the touch electrode.

20. The display device of claim 16, wherein the touch signal line further includes a third conductive layer disposed on the second conductive layer, wherein the third conductive layer is in contact with the second conductive layer.

21. A manufacturing method of a touch sensor unit, the manufacturing method comprising:
preparing a substrate that includes a touch sensor area and a touch peripheral area; and
forming a touch signal line on the substrate,
wherein forming the touch signal line in the touch peripheral area includes:
forming a first conductive layer on the substrate;
forming an insulating layer on the first conductive layer;
forming a contact hole in the insulating layer, wherein contact hole exposes at least a portion of the first conductive layer; and
forming a second conductive layer on the insulating layer after the forming of the first conductive layer, wherein the second conductive layer is in contact with the first conductive layer through the contact hole,
wherein the first conductive layer includes at least one of molybdenum niobium (MoNb), or tantalum (Ta), and
wherein the second conductive layer includes aluminum niobium (AlNb),
wherein the touch signal line prevents formation of an oxide layer of aluminum niobium at an interface between the first conductive layer and the second conductive layer where the first conductive layer and the second conductive layer are in contact with each other, and wherein the interface where the first conductive layer and the second conductive layer are in contact with each other has an uneven portion, wherein the interface extends in directions parallel to extension directions of the substrate and the uneven portion extends in a direction perpendicular to the extension directions of the substrate.

22. The manufacturing method of claim 21, wherein forming the touch signal line further includes forming a third conductive layer on the second conductive layer wherein the third conductive layer is in contact with the second conductive layer.

23. An electronic device, comprising:

a display panel; and a touch sensing unit disposed on the display panel, wherein the touch sensing unit includes:

a substrate;

a touch electrode disposed in a touch sensor area of the substrate; and a touch signal line connected to the touch electrode and that extends to a touch peripheral area of the substrate, wherein in at least the touch peripheral area, the touch signal line includes a first conductive layer disposed on the substrate, and a second conductive layer disposed on the first conductive layer with an insulating layer interposed therebetween, wherein the second conductive layer is in contact with the first conductive layer through a contact hole in the insulating layer, wherein the first conductive layer includes at least one of molybdenum niobium (MoNb), or tantalum (Ta), wherein the second conductive layer includes aluminum niobium (AlNb), wherein the touch signal line prevents formation of an oxide layer of aluminum niobium at an interface between the first conductive layer and the second conductive layer where the first conductive layer and the second conductive layer are in contact with each other, and wherein the interface where the first conductive layer and the second conductive layer are in contact with each other has an uneven portion, wherein the interface extends in directions parallel to extension directions of the substrate and the uneven portion extends in a direction perpendicular to the extension directions of the substrate.

* * * * *